(12) United States Patent
Nishikido et al.

(10) Patent No.: US 11,362,122 B2
(45) Date of Patent: Jun. 14, 2022

(54) SOLID-STATE IMAGING ELEMENT AND IMAGING APPARATUS

(71) Applicant: SONY SEMICONDUCTOR SOLUTIONS CORPORATION, Kanagawa (JP)

(72) Inventors: Kenju Nishikido, Kumamoto (JP); Suguru Moriyama, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 134 days.

(21) Appl. No.: 16/625,139

(22) PCT Filed: May 16, 2018

(86) PCT No.: PCT/JP2018/018886
§ 371 (c)(1),
(2) Date: Dec. 20, 2019

(87) PCT Pub. No.: WO2019/003681
PCT Pub. Date: Jan. 3, 2019

(65) Prior Publication Data
US 2021/0343770 A1 Nov. 4, 2021

(30) Foreign Application Priority Data
Jun. 29, 2017 (JP) .............................. JP2017-127584

(51) Int. Cl.
*H01L 27/146* (2006.01)
*H04N 5/361* (2011.01)

(52) U.S. Cl.
CPC .. *H01L 27/14623* (2013.01); *H01L 27/14621* (2013.01); *H01L 27/14627* (2013.01); *H01L 27/14685* (2013.01); *H04N 5/361* (2013.01)

(58) Field of Classification Search
CPC ......... H01L 27/14621; H01L 27/14623; H01L 27/14627; H01L 27/14645; H01L 27/3246; H01L 27/3272
See application file for complete search history.

(56) References Cited

U.S. PATENT DOCUMENTS 7,795,656 B2\* 9/2010 Moon .................... H04N 5/361
257/294
2007/0290245 A1\* 12/2007 Unagami .......... H01L 27/14623
257/294

(Continued)

FOREIGN PATENT DOCUMENTS

CN 106068563 A 11/2016
JP 06-204443 A 7/1994

(Continued)

OTHER PUBLICATIONS

International Search Report and Written Opinion of PCT Application No. PCT/JP2018/018886, dated Aug. 7, 2018, 10 pages of ISRWO.

*Primary Examiner* — Scott B Geyer
(74) *Attorney, Agent, or Firm* — Chip Law Group

(57) ABSTRACT

Variations in photoelectric conversion performance between pixels (valid pixels and light-shielding pixels) in an imaging element are reduced. A solid-state imaging element includes: a plurality of pixels including a color filter for transmitting a light having a predetermined wavelength among incident lights, a photoelectric conversion portion formed on a semiconductor substrate and for performing photoelectric conversion in accordance with a light transmitted through the color filter, and an insulating layer placed between the color filter and the semiconductor substrate; light-shielding pixels among the plurality of pixels, including a first light-shielding portion disposed in a vicinity of the color filter on the insulating layer and for shielding the light transmitted (Continued)

through the color filter in its own pixel; and a second light-shielding portion disposed on the insulating layer between the plurality of pixels and the light-shielding pixels, and for shielding a light transmitted through the color filter of the adjacent pixel.

10 Claims, 29 Drawing Sheets

(56) References Cited

U.S. PATENT DOCUMENTS

| | | | | |
|---|---|---|---|---|
| 2011/0193188 A1* | 8/2011 | Wang | ................ | H01L 27/14623 257/432 |
| 2014/0014818 A1* | 1/2014 | Cho | ................ | H04N 5/232122 250/208.1 |
| 2014/0044390 A1* | 2/2014 | Naruse | ............. | H01L 27/14623 385/14 |
| 2014/0217538 A1* | 8/2014 | Shimotsusa | ....... | H01L 27/14623 257/432 |
| 2015/0056741 A1* | 2/2015 | Kurihara | ........... | H01L 31/02327 438/70 |
| 2015/0179692 A1* | 6/2015 | Furuta | ............... | H01L 27/14685 257/432 |
| 2016/0005782 A1* | 1/2016 | Aoki | ................ | H01L 27/14623 257/435 |
| 2016/0035921 A1* | 2/2016 | Matsuda | ........... | H01L 27/14645 348/374 |
| 2016/0307952 A1* | 10/2016 | Huang | ............... | H01L 27/14636 |
| 2017/0062497 A1* | 3/2017 | Goto | ................. | H01L 27/14623 |
| 2017/0287960 A1* | 10/2017 | Masuda | ............ | H01L 27/14621 |
| 2017/0338265 A1 | 11/2017 | Yoshiba et al. | | |
| 2018/0286897 A1* | 10/2018 | Watanabe | ......... | H01L 27/14627 |
| 2019/0088700 A1* | 3/2019 | Yang | ................ | H01L 27/14623 |

FOREIGN PATENT DOCUMENTS

| | | |
|---|---|---|
| JP | 07-161952 A | 6/1995 |
| JP | 2009-188068 A | 8/2009 |
| KR | 10-2017-0103624 A | 9/2017 |
| WO | 2016/114154 A1 | 7/2016 |

* cited by examiner

SOLID-STATE IMAGING ELEMENT AND IMAGING APPARATUS

CROSS REFERENCE TO RELATED APPLICATIONS

This application is a U.S. National Phase of International Patent Application No. PCT/JP2018/018886 filed on May 16, 2018, which claims priority benefit of Japanese Patent Application No. JP 2017-127584 filed in the Japan Patent Office on Jun. 29, 2017. Each of the above-referenced applications is hereby incorporated herein by reference in its entirety.

TECHNICAL FIELD

The present technology relates to a solid-state imaging element and an imaging apparatus. Specifically, the present technology relates to a solid-state imaging element and an imaging apparatus which have optical black pixels.

BACKGROUND ART

In the past, in a solid-state imaging element, a light-shielding film for shielding a photodiode of an optical black (OPB) pixel for defining a black level has been placed in a lower layer portion of a wiring layer (a position close to the photodiode in the wiring layer). On the other hand, PTL 1 discloses a technology that a light-shielding film is placed on a position higher than wiring layers (in a layer between the wiring layers and a color filter).

In the technology of PTL 1, the wiring layers including a plurality of metal wiring layers are laminated on a substrate on which a large number of photodiodes as light-receiving portions are formed, and then subjected to heat treatment called a hydrogenation treatment. This hydrogenation treatment refers to a heat treatment carried out in an atmosphere containing hydrogen, or a heat treatment under an environment where hydrogen is diffused from constituent films or the like in the wiring layers themselves in the course of the treatment, and this hydrogenation treatment is carried out to improve electrical characteristics of the light-receiving portions. This hydrogenation treatment is carried out prior to the light-shielding film-forming step, so that it is possible to suppress variations in the hydrogenation treatment between OPB pixels and valid pixels where the light-shielding film is placed.

CITATION LIST

Patent Literature

[PTL 1]
JP 2008-198993A

SUMMARY

Technical Problem

In the aforementioned technology in PTL 1, light is shielded by a blue filter and an amorphous silicon film. Since the blue filter and the amorphous silicon film have a relatively high light transmittance, the aforementioned technology in PTL 1 has a problem that light cannot be sufficiently shielded.

The present technology has been made in view of the aforementioned problem, and a structure and a manufacturing method for reducing variations in photoelectric conversion performance between pixels (valid pixels and OPB pixels) in a solid-state imaging element are proposed.

Solution to Problem

The first aspect of the present technology is a solid-state imaging element including: a plurality of pixels including a color filter for transmitting a light having a predetermined wavelength among incident lights, a photoelectric conversion portion formed on a semiconductor substrate and for performing photoelectric conversion in accordance with a light transmitted through the color filter, and an insulating layer placed between the color filter and the semiconductor substrate; light-shielding pixels among the plurality of pixels, further including a first light-shielding portion disposed in a vicinity of the color filter on the insulating layer and for shielding the light transmitted through the color filter in its own pixel; and a second light-shielding portion disposed on the insulating layer between the plurality of pixels and the light-shielding pixels, and for shielding a light transmitted through the color filter of the adjacent pixel.

Further, the second aspect of the present technology is an imaging apparatus including: a plurality of pixels including a color filter for transmitting a light having a predetermined wavelength among incident lights, a photoelectric conversion portion formed on a semiconductor substrate and for performing photoelectric conversion in accordance with a light transmitted through the color filter, and an insulating layer placed between the color filter and the semiconductor substrate; light-shielding pixels among the plurality of pixels, further including a first light-shielding portion disposed in a vicinity of the color filter on the insulating layer and for shielding the light transmitted through the color filter in its own pixel; a second light-shielding portion disposed on the insulating layer between the plurality of pixels and the light-shielding pixels, and for shielding a light transmitted through the color filter of the adjacent pixel; and a processing circuit for processing image signals based on electric charges generated by photoelectric conversion in each photoelectric conversion portion in the plurality of pixels and the light-shielding pixels.

In the light-shielding pixels, a first light-shielding portion for shielding light is formed in the insulating layer. The insulating layer supplies hydrogen to the semiconductor substrate during heat treatment in a step of manufacturing the solid-state imaging element. The first light-shielding portion is disposed in the vicinity of the color filter in the insulating layer, so that hydrogen is supplied from the insulating layer to the semiconductor substrate in a step preceding to the first light-shielding portion-forming step. This brings the effect that amounts of hydrogen supplied to the semiconductor substrate are substantially equal between the pixels and the light-shielding pixels.

Note that the solid-state imaging element explained above includes various aspects, e.g. the imaging is executed while the solid-state imaging element is incorporated in other equipment, or the imaging is executed in combination with another method.

Advantageous Effect of Invention

The present technology makes it possible to reduce variations in photoelectric conversion performance between pixels (valid pixels and light-shielding pixels) in the solid-state imaging element. Note that the effect described in the present specification is merely an example and is not limited, and may include additional effects.

DESCRIPTION OF EMBODIMENTS

Figure 1A:
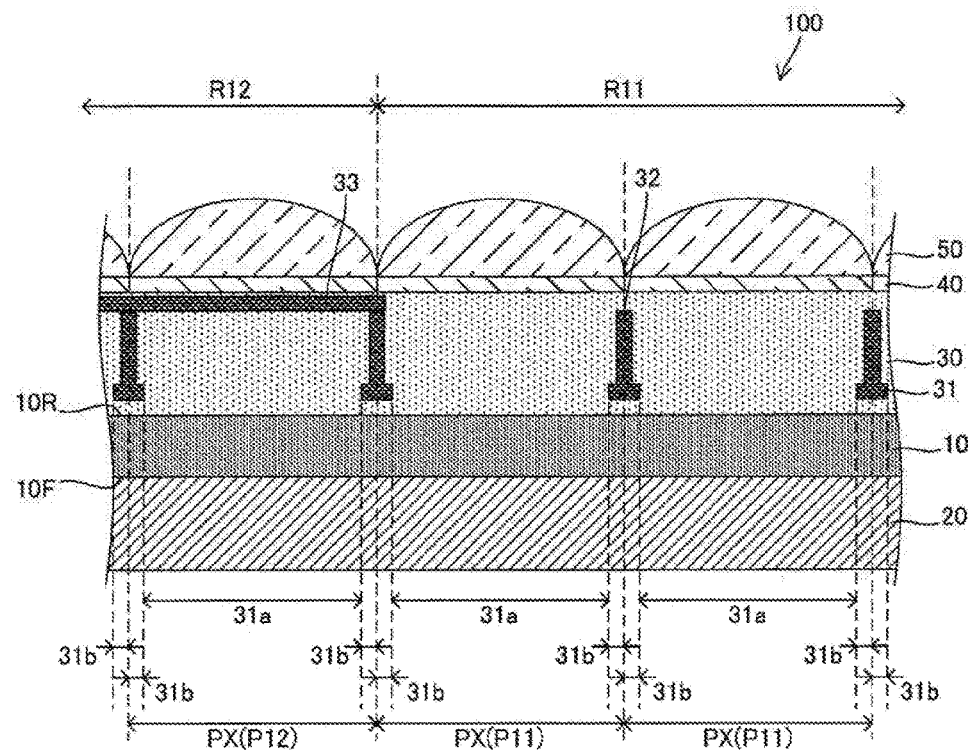
FIGS. 1A and 1B are diagrams schematically depicting a schematic sectional structure of a solid-state imaging element according to a first embodiment.
Figure 1B:
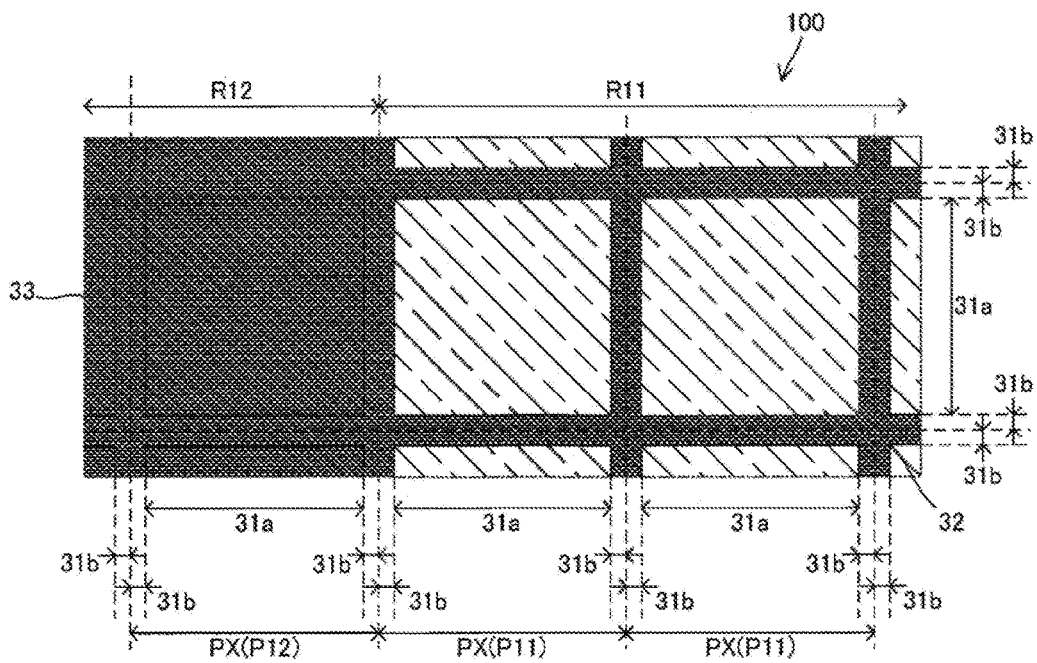

Next, embodiments of the present technology will be explained with reference to figures. Note that the embodiments will be explained in the following order.
1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Applicable example for endoscopic surgery system
10. Applicable example for mobile body 1. First Embodiment FIGS. 1A and 1B are diagrams schematically depicting a schematic sectional structure of a solid-state imaging element according to the first embodiment. FIG. 1A is a diagram illustrating a sectional configuration of a solid-state imaging element 100, and FIG. 1B is a diagram illustrating a configuration of a surface of the solid-state imaging element 100. The solid-state imaging element 100 is a back-illuminated type CMOS (Complementary Metal Oxide Semiconductor) imaging element. Hereinafter, the imaging element according to the embodiment of the present technology will be explained with reference to the back-illuminated type CMOS imaging element. Note that, hereinafter, the upper and lower directions in FIGS. 1A and 1B are phrased as "upper side/lower side" in some cases, and furthermore, in each configuration depicted in FIGS. 1A and 1B, the upper side is referred to as a backside face, and the lower side is referred to as a top face in some cases.

In the solid-state imaging element 100, a wiring layer 20 is laminated on one face (top face 10F in the figure) of a semiconductor substrate 10, and an insulating layer 30, a color filter layer 40, and an on-chip lens layer 50 are sequentially laminated on the other face (backside face 10R in the figure) of the semiconductor substrate 10. Another layer may be laminated between the semiconductor substrate 10 and each layer. Note that, in FIG. 1B, illustration of the on-chip lens layer 50 is omitted.

The wiring layer 20 has a configuration of a multi-layered wiring layer, including: a plurality of conductive layers constituting wirings, electrodes and the like; an intralayer insulating layer for insulating between the conductive layers; and a contact penetrating the intralayer insulating layer to connect the conductive layers. The wiring layer 20 is appropriately connected with gates/sources/drains of pixel transistors (transfer transistor, selection transistor, amplification transistor, reset transistor, and the like) formed on the semiconductor substrate 10.

As the semiconductor substrate 10, for example, a semiconductor substrate body such as a silicon substrate; a compound semiconductor; and other semiconductor substrate bodies applied to general solid-state imaging elements can be used.

In the semiconductor substrate 10, an impurity diffusion layer (not illustrated in the figure) constituting source/drain regions of an MOS transistor constituting the pixel transistor, a photodiode (not illustrated in the figure) as a photoelectric conversion element, and the like are disposed at the top face 10F side facing the wiring layer 20. In the wiring layer 20 covering a portion as a channel between the source/drain regions of the MOS transistor, a gate electrode (not illustrated in the figure) of the MOS transistor is formed via a gate insulating film. The photodiode generates electric charges (electron/hole pair) corresponding to lights that have passed through the color filter layer 40 among lights incident from the backside face 10R side of the semiconductor substrate 10. Image signals corresponding to the generated electric charges are generated and output by a pixel circuit (not illustrated in the figure) formed on the semiconductor substrate 10. Incidentally, the color filter layer 40 is an optical filter for transmitting lights having predetermined wavelengths. Incidentally, the photoelectric conversion element is an example of a photoelectric conversion portion described in claims.

Figure 2:
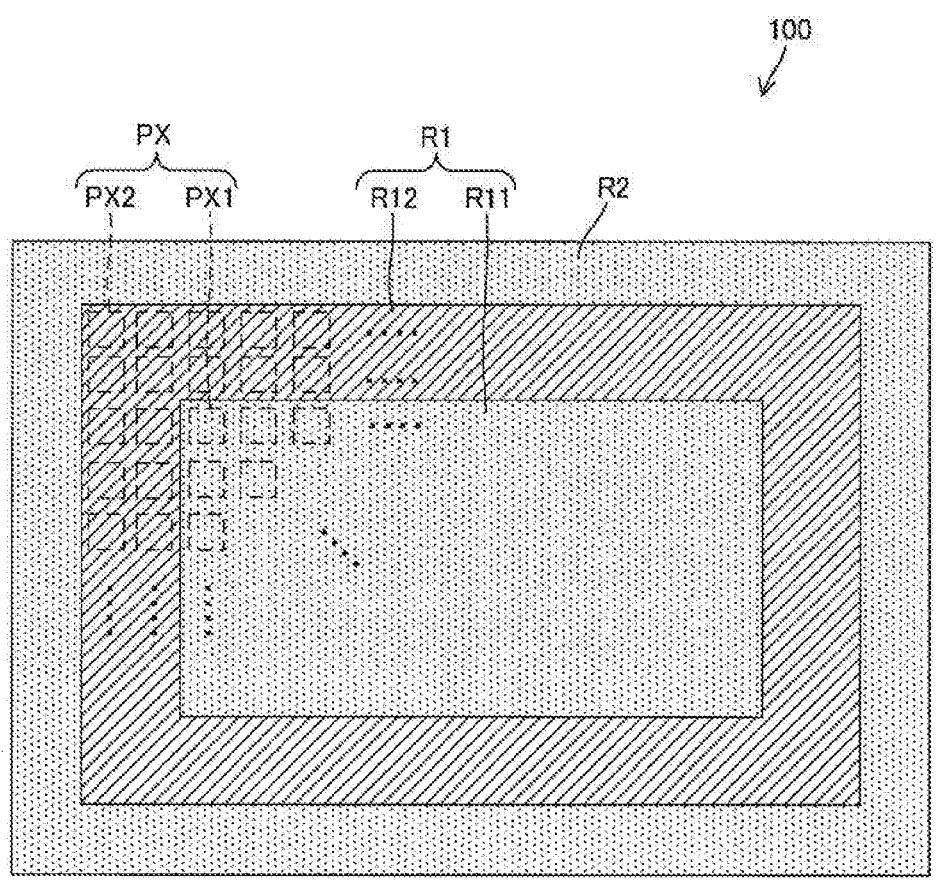
FIG. 2 is a diagram depicting a pixel array of the solid-state imaging element according to the first embodiment in plan view.

FIG. 2 is a diagram depicting a pixel array of the solid-state imaging element according to the first embodiment in plan view. The solid-state imaging element 100 has a pixel region R1 in which a plurality of pixels is two-dimensionally arranged, and FIG. 2 depicts an example that the pixels are arranged in an XY matrix. Outside the pixel region R1, a peripheral circuit region R2 having a pixel drive circuit, and a peripheral circuit for processing the image signals generated by the pixels are disposed as necessary. Herein, the processing of the image signals in the peripheral circuit region R2 corresponds to, for example, analog/digital conversion. The solid-state imaging element 100 including the peripheral circuit region R2 constitutes an imaging apparatus. Incidentally, the peripheral circuit is an example of a processing circuit described in claims.

The pixel region R1 includes a valid pixel region R11 having valid pixels P11, and an OPB pixel region R12 having OPB pixels P12. In the example depicted in FIG. 2, the OPB pixel region R12 is formed in a substantially rectangular frame shape surrounding the substantially rectangular valid pixel region R11.

The valid pixels P11 have a structure that light incident from the back face side of the solid-state imaging element 100 reaches the photodiode formed on the semiconductor substrate 10. The OPB pixels P12 have a structure that light incident from the back face side of the solid-state imaging element 100 is shielded so as not to reach the photodiode formed on the semiconductor substrate 10.

The pixel region R1 of the semiconductor substrate 10 includes a plurality of unit pixels PX (PX1 and PX2 in FIG. 2) corresponding to the valid pixels P11 and the OPB pixels P12 respectively. The photoelectric conversion elements of the unit pixels PX adjacent to each other are partitioned by element-separating regions made of a P-type semiconductor extending in a thickness direction of the semiconductor substrate 10. The image signals are generated in both the valid pixels P11 and the OPB pixels P12. Among them, the image signals generated by the valid pixels P11 are image signals corresponding to the incident light of the solid-state imaging element 100, and are based on a photographic subject.

On the other hand, the image signals generated by the OPB pixels P12 are image signals in a light-shielded state, and can be used for defining a black level for output image signals of the solid-state imaging element 100. Specifically, image signals generated by the OPB pixels P12 are subtracted from image signals generated by the valid pixels P11 to generate image signals in which the image signals generated by the OPB pixels P12 are specified as a black level. In addition, the image signals generated by the OPB pixels P12 can also be used for measuring a dark current in the unit pixels PX. Herein, the dark current refers to a current based on electric charges generated by factors other than the photoelectric conversion by incident light, and corresponds to noises in the image signals. The OPB pixels P12 are arranged, the dark current is measured, and the dark current is subtracted from the image signals generated by the valid pixels P11, so that the noises in the image signals based on the dark current can be reduced. Incidentally, subtraction of these image signals can be carried out by the aforementioned peripheral circuit.

The dark current described above is generated by a current flowing from the circumference into the valid pixels P11 and the like. Specifically, the dark current is generated when electric charges resulting from an interface state generated on the surface of the semiconductor substrate 10 flow into the photoelectric conversion elements of the valid pixels P11 and the like. This interface state is a defect formed when silicon (Si) constituting the semiconductor substrate 10 generates a dangling bond which is an unbonded element at the end portion of the semiconductor substrate 10. This dangling bond is terminated with hydrogen, so that the interface state and the dark current can be reduced. The termination with hydrogen can be carried out by a heat treatment in which the semiconductor substrate 10 is heated while the hydrogen supplied to the semiconductor substrate 10. This heat treatment can be performed in a step of forming the insulating layer 30 described later.

The insulating layer 30 is transparent and formed with a constant thickness. The insulating layer 30 can include, for example, silicon oxide ($SiO_2$) or silicon nitride (SiN). In addition, the insulating layer 30 includes a plurality of light-shielding portions. In the present embodiment, the insulating layer 30 includes a light-shielding film 31, a light-shielding wall 32, and a light-shielding film 33. Note that the valid pixels P11 are an example of pixels described in claims. The OPB pixels P12 are an example of light-shielding pixels described in claims. The light-shielding film 31 is an example of a third light-shielding portion described in claims. The light-shielding wall 32 is an example of a second light-shielding portion described in claims. The light-shielding film 33 is an example of a first light-shielding portion described in claims.

For the light-shielding portions such as the light-shielding film 31, the light-shielding wall 32, and the light-shielding film 33, metals (e.g. tungsten (W), titanium (Ti), copper (Cu), tantalum (Ta), and aluminum (Al)) can be used. In addition, a metal nitride (e.g. titanium nitride (TiN), tantalum nitride (TaN), tungsten nitride (WN), and aluminum nitride (AlN)), and the like can also be used as the light-shielding portions. Furthermore, a laminated film containing at least one of these metals and metal nitrides can also be adopted as the light-shielding portions. In the following description, the aforementioned metals or metal nitrides are referred to as light-shielding materials. Surfaces of the light-shielding portions formed of these light-shielding materials are covered with a barrier metal film as necessary.

In the vicinity of the semiconductor substrate 10, in a thickness direction of the insulating layer 30, the light-shielding film 31 is formed as a flat layer extending substantially parallel to the backside face 10R of the semiconductor substrate 10. In addition, regarding the light incidence from the insulating layer 30 to the photoelectric conversion element of the semiconductor substrate 10 in the unit pixel PX, the valid pixels P11 and the like are divided into a light-receiving region 31a and the light-shielding region 31b by the light-shielding film 31 on a planed (see FIG. 1B). The light-receiving region 31a is not covered with the light-shielding film 31 in each unit pixel PX and is a region where light can be incident on the photoelectric conversion element of the semiconductor substrate 10 from the insulating layer 30. The light-shielding region 31b is covered with the light-shielding film 31 in each unit pixel PX and is a region where light incident from the insulating layer 30 to the photoelectric conversion element of the semiconductor substrate 10 is shielded. Thus, the light-shielding film 31 is placed adjacent to the end portion of the light-shielding wall 32 in the vicinity of the semiconductor substrate 10 in the insulating layer 30, and has an opening portion.

The light-shielding wall 32 is formed as a partition-like partitioning wall extending in a thickness direction of the solid-state imaging element 100 along a pixel boundary between the unit pixels PX on the insulating layer 30. The semiconductor substrate 10-side end portion of the light-shielding wall 32 is formed in contact with the backside face of the light-shielding film 31, and the color filter layer 40-side end portion of the light-shielding wall 32 is formed in the vicinity of or in contact with the surface of the color filter layer 40. The light-shielding wall 32 prevents color mixture caused when light is incident on the adjacent unit pixel in the transparent insulating layer 30. As described above, the light-shielding wall 32 is disposed in the insulating layer 30 between the unit pixels PX, and shields light transmitted through the color filter layer 40 of the adjacent unit pixel PX.

In the insulating layer 30 of the OPB pixel P12, at a position closer to the color filter layer 40 within a range for forming the light-shielding wall 32 in a thickness direction of the solid-state imaging element 100, the light-shielding film 33 extends in a face direction of the solid-state imaging element 100 to cover each OPB pixel P12. FIGS. 1A and 1B depict the light-shielding film 33 placed as a flat layer substantially parallel to the backside face 10R of the semiconductor substrate 10 so as to cover the entire OPB pixel P12 in the vicinity of the boundary with the color filter layer 40. In the direction parallel to the backside face 10R of the semiconductor substrate 10, both end portions of the light-shielding film 33 are formed in contact with the light-shielding wall 32 disposed on a boundary between the unit pixels PX. As described above, the light-shielding film 33 is placed in the vicinity of the color filter layer 40 on the insulating layer 30 to shield light transmitted through the color filter layer 40 in the OPB pixel of the light-shielding film 33.

As explained above, the OPB pixel P12 is covered by a bottomed rectangular cylindrical light-shielding structure in which an upper side is closed by the light-shielding wall 32 and the light-shielding film 33 and a lower side is opened, and furthermore, the light-shielding film 31 having a width larger than that of the light-shielding wall 32 is integrally formed on a lower opening edge of the light-shielding structure. Thereby, color mixture due to light obliquely incident on the OPB pixel P12 through the adjacent valid pixel P11 is reduced as much as possible.

In the solid-state imaging element 100 configured as described above, most parts of structures close to the semiconductor substrate 10 on the insulating layer 30 substantially coincide with each other between the valid pixel P11 and the OPB pixel P12. In a heat treatment step performed during manufacture of the solid-state imaging element 100, on the side close to the semiconductor substrate 10, structures possibly serving as hydrogen sources (hereinafter referred to as hydrogen sources) in the element substantially coincide with each other between the valid pixel P11 and the OPB pixel P12. Thereby, variations in amounts of hydrogen supplied to the semiconductor substrate 10 between the valid pixel P11 and the OPB pixel P12 are suppressed, and variations in pixel characteristics (dark current characteristic, and the like) between the valid pixel P11 and the OPB pixel P12 are suppressed.

That is, film thicknesses of the insulating layer 30 in contact with the semiconductor substrate 10 can be substantially equal between the valid pixel P11 and the OPB pixel P12. Hydrogen is released during the heat treatment in forming the insulating layer 30 made of $SiO_2$ and the like on the semiconductor substrate 10. This released hydrogen is supplied to the semiconductor substrate 10, resulting in the aforementioned termination with hydrogen. In this case, $SiO_2$ plays a role of the aforementioned hydrogen source. The film thicknesses of the insulating layers 30 are made equal between the valid pixel P11 and the OPB pixel P12, so that substantially the same amount of hydrogen can be supplied to the semiconductor substrates 10 on which the valid pixel P11 and the OPB pixel P12 are formed. As a result, the dark currents can be substantially equal between the valid pixel P11 and the OPB pixel P12, and the black level can be defined and the noises can be reduced for the image signals.

For the hydrogen source, a material (a material gas, an etching gas, a gas for treatment such as oxidation-reduction, or the like) capable of generating hydrogen during a step of forming the structure is used. Examples of the material include $SiO_2$ and SiN produced using a silane gas, tungsten for plasma treatment with a gas containing hydrogen gas, and the like.

FIGS. 3A, 3B, 3C, 3D, 4A, 4B, 4C, 5A, 5B, 5C, 6A, 6B, and 6C are diagrams for explaining an example of a manufacturing method for the solid-state imaging element according to the first embodiment.

Figure 3A:
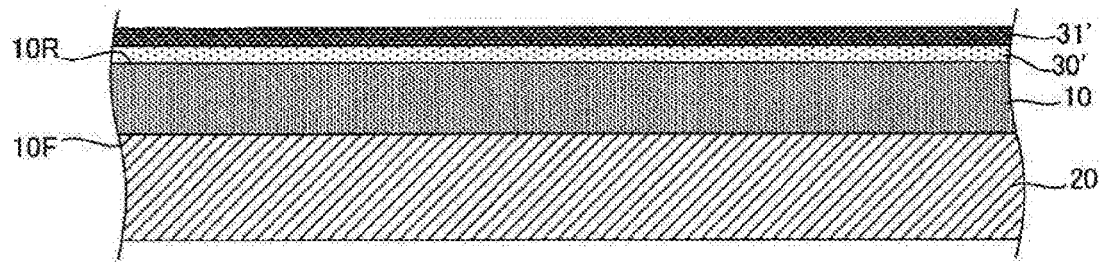
FIGS. 3A, 3B, 3C, and 3D are diagrams for explaining an example of a manufacturing method for the solid-state imaging element according to the first embodiment.

First, an insulating layer 30' formed by laminating a thin transparent insulating material such as SiO2 is placed on the backside face 10R of the semiconductor substrate 10 on which the wiring layer 20 is laminated at the top face 10F side. Next, a light-shielding film 31' made of the aforementioned light-shielding material and having a predetermined thickness is placed on the insulating layer 30' (FIG. 3A). The light-shielding film 31' only needs to have a thickness with a light shielding effect.

Figure 3B:
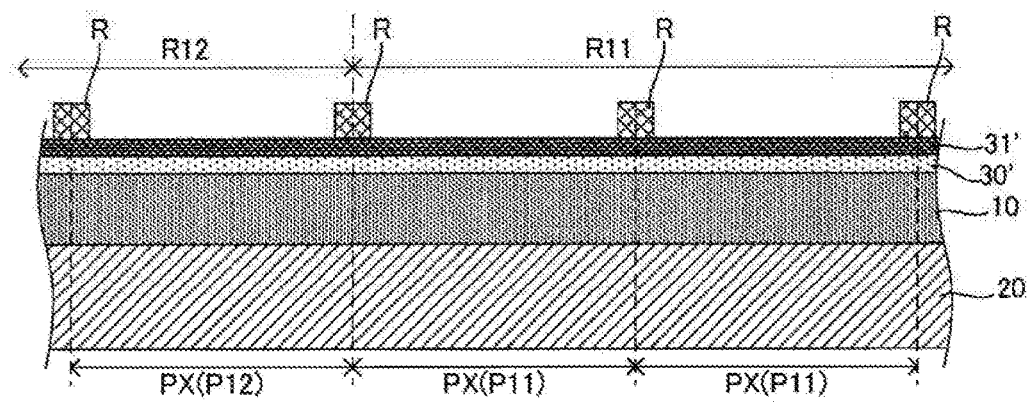
Figure 3C:
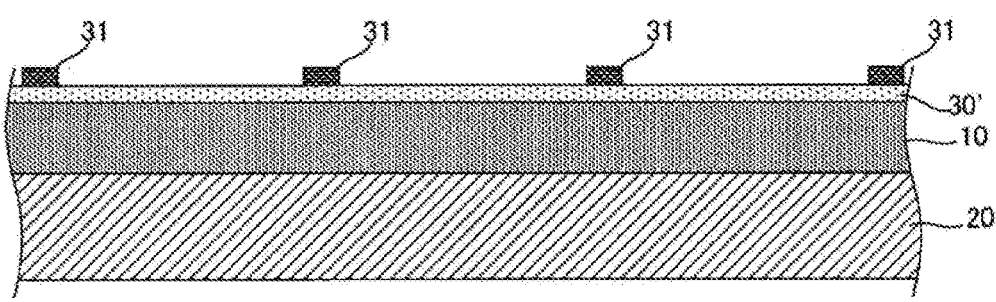

Next, a resist R as an etching mask is formed on the light-shielding film 31' by photolithography (FIG. 3B). The resist R is formed at the same position as the light-shielding film 31 formed with a constant width along the boundary between the unit pixels PX in plan view, and is formed so as to have the same width as the light-shielding film 31. Then, an unnecessary portion of the light-shielding film 31' is removed by etching while a portion corresponding to the light-shielding film 31 is left, and the resist R is removed to form the light-shielding film 31 (FIG. 3C).

Figure 3D:
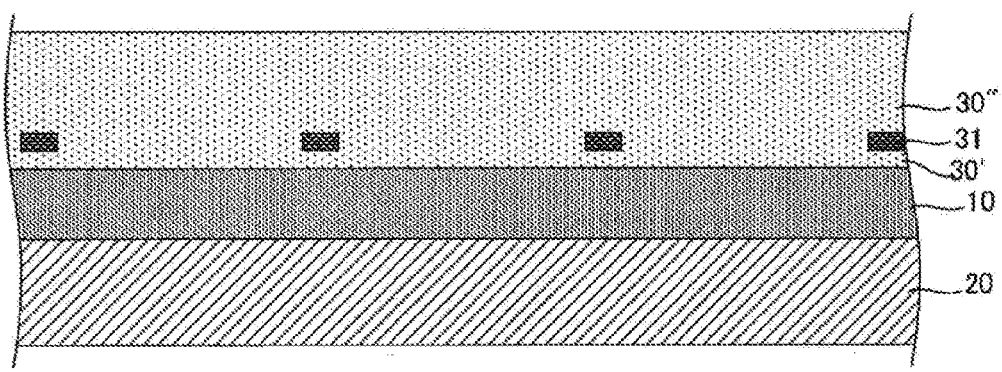

Next, the same transparent insulating material as that for the insulating layer 30', such as SiO2 is laminated on the light-shielding film 31 to form an insulating layer 30", so that the light-shielding film 31 is embedded in the insulating layers 30' and 30" (FIG. 3D). A thickness of the insulating layer 30" is substantially equal to the height of the light-shielding wall 32. A surface of the insulating layer 30" is flattened by polishing/grinding techniques such as chemical machinery polishing as necessary.

Figure 4A:
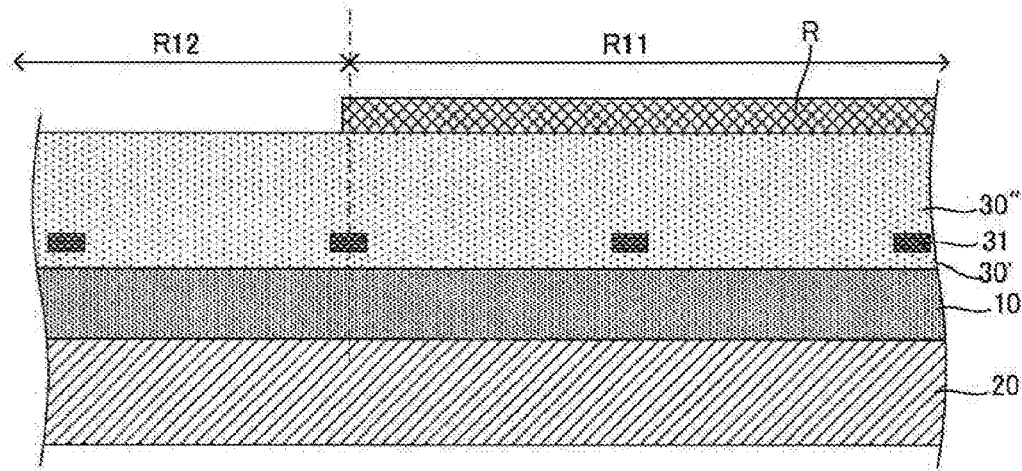
FIGS. 4A, 4B, and 4C are another diagrams for explaining an example of the manufacturing method for the solid-state imaging element according to the first embodiment.
Figure 4B:
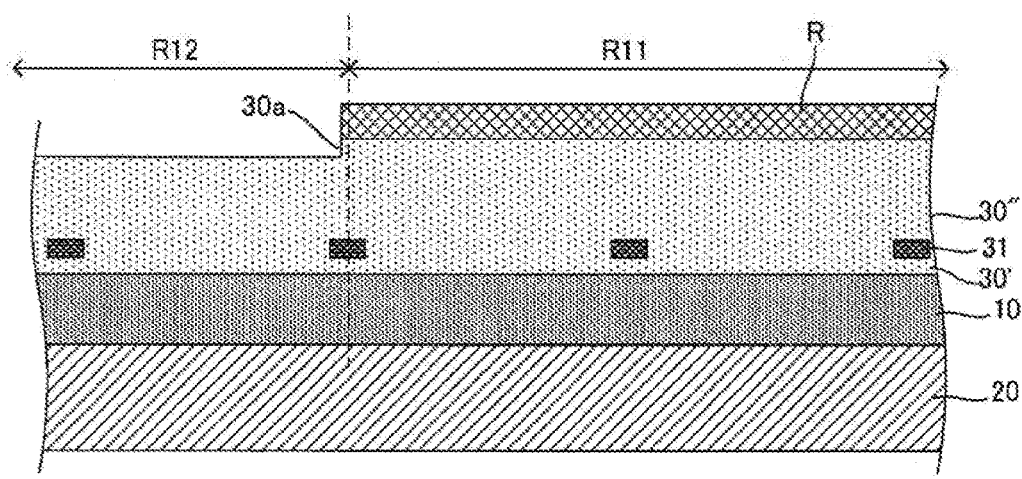
Figure 4C:
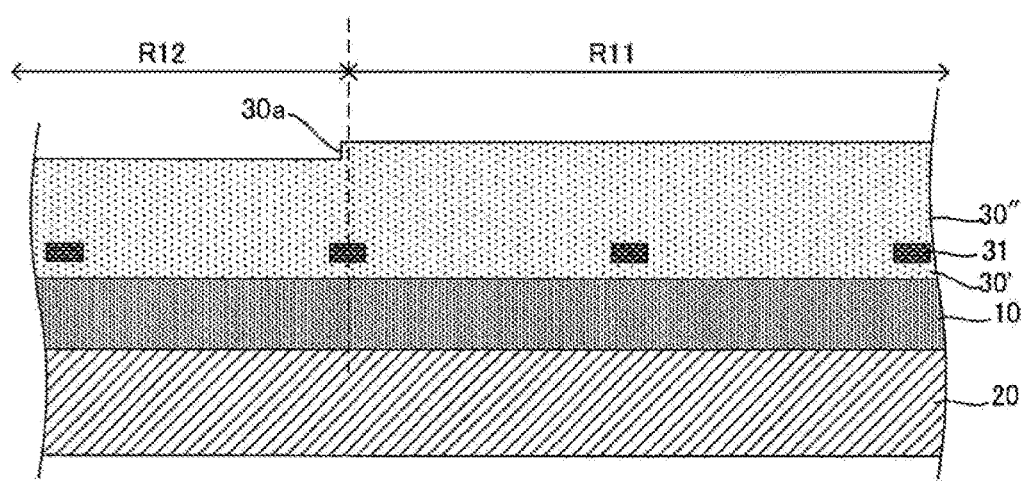

Next, a stepped portion 30a is formed on an upper face of the insulating layer 30" (FIGS. 4A, 4B, and 4C). The stepped portion 30a is formed along the boundary between the valid pixel region R11 and the OPB pixel region R12, so that the OPB pixel region R12 is formed to be totally lower than the valid pixel region R11.

The step height of the stepped portion 30a can be equal to the thickness of the light-shielding film 33. Specifically, the resist R for covering the valid pixel region R11 on the insulating layer 30" is formed by a photolithography (FIG. 4A). Subsequently, the upper face of the insulating layer 30" in the OPB pixel region R12 is excavated by etching using the resist R as an etching mask, so that the upper face of the insulating layer 30" in the OPB pixel region R12 is lower than the upper face of the insulating layer 30" in the valid pixel region R11 (FIG. 4B). After that, the resist R is removed to form the stepped portion 30a along the boundary between the valid pixel region R11 and the OPB pixel region R12 (FIG. 4C).

Figure 5A:
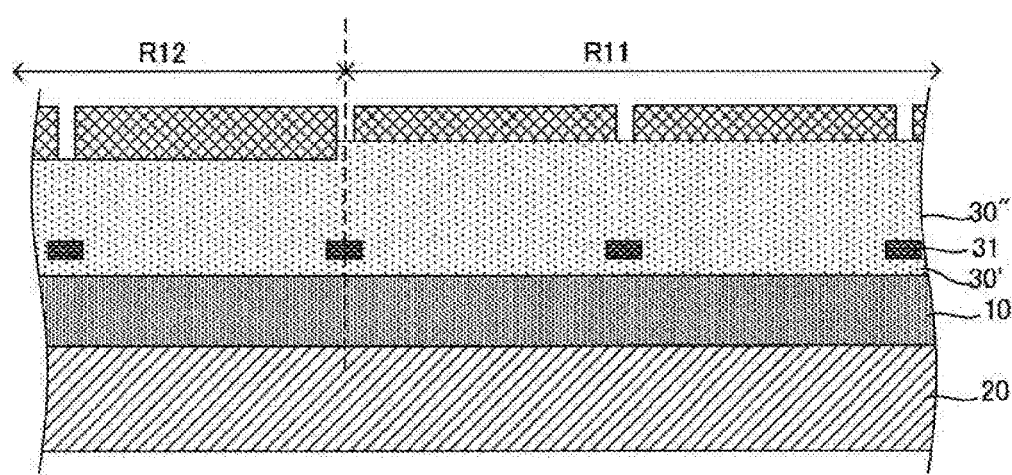
FIGS. 5A, 5B, and 5C are still another diagrams for explaining an example of the manufacturing method for the solid-state imaging element according to the first embodiment.
Figure 5B:
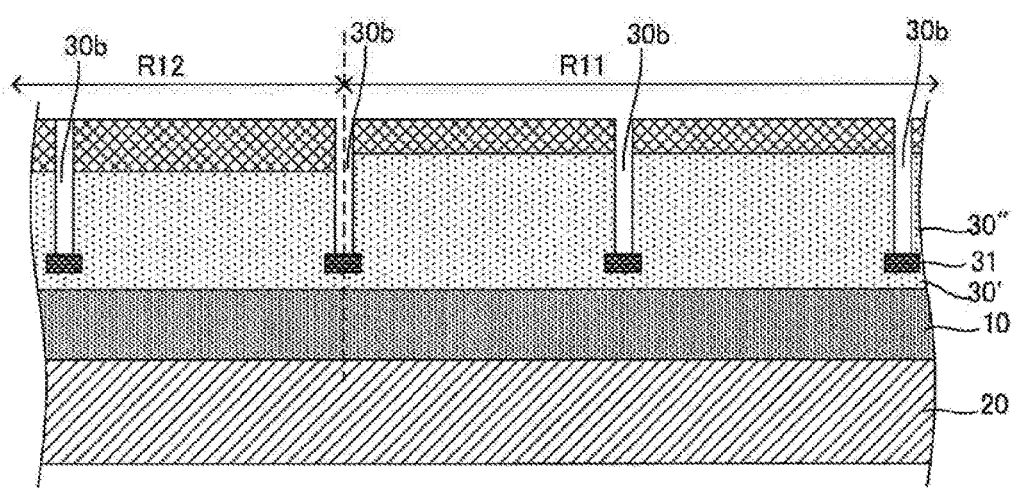
Figure 5C:
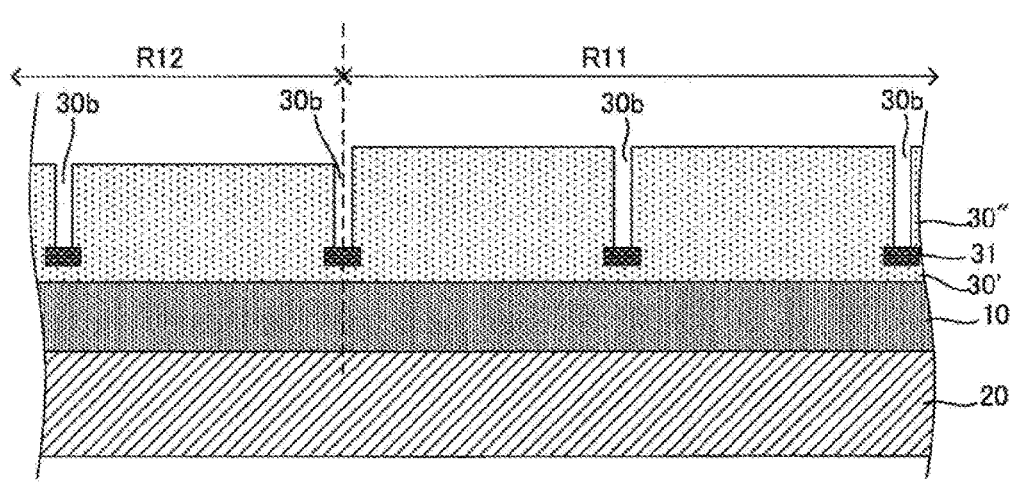

Next, vertical holes 30b having a depth reaching the upper face of the light-shielding film 31 are formed along each boundary between the unit pixels PX on the insulating layer 30" (FIGS. 5A, 5B, and 5C). A width of the vertical holes 30b can be substantially equal to the width of the light-shielding wall 32. Specifically, the resist R for covering the upper face of the insulating layer 30" excluding the range for forming the light-shielding wall 32 in plan view is formed by the photolithography (FIG. 5A). Using the resist R as an etching mask, a portion along each boundary between the unit pixels PX is excavated by etching until the excavation reaches the light-shielding film 31 (FIG. 5B). Then, the resist R is removed to form the vertical holes 30b (FIG. 5C).

Figure 6A:
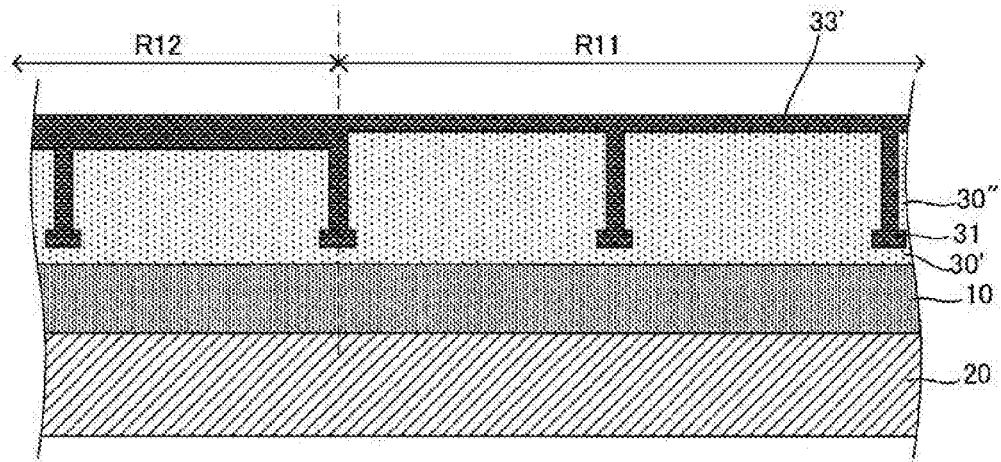
FIGS. 6A, 6B, and 6C are further another diagrams for explaining an example of the manufacturing method for the solid-state imaging element according to the first embodiment.
Figure 6B:
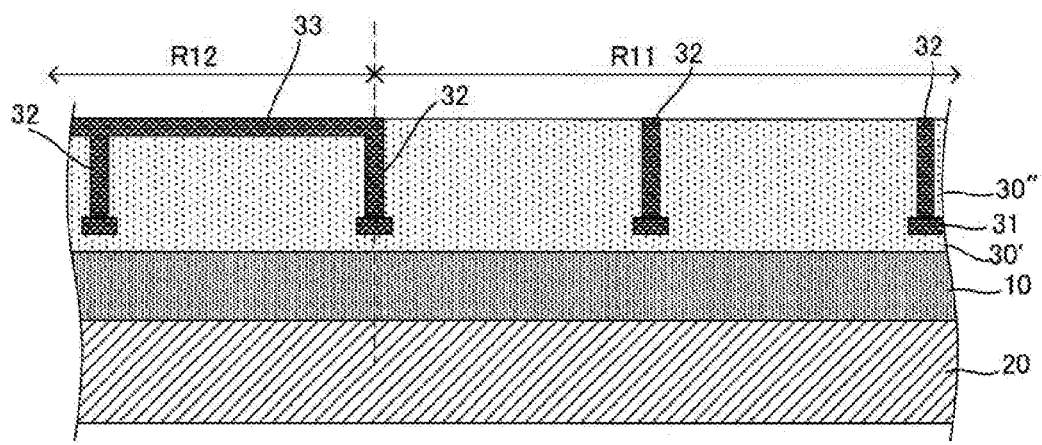

Next, the light-shielding wall 32 and the light-shielding film 33 are formed in the same step (FIGS. 6A and 6B). Specifically, a film made of the aforementioned light-shielding material and the like is laminated on the insulating layer 30" having the stepped portion 30a and the vertical holes 30b (FIG. 6A). At this time, a light-shielding film 33' having a thickness equal to or larger than the step height of the stepped portion 30a is laminated on the upper face of the insulating layer 30" while the light-shielding material into the vertical holes 30b is changed. Then, an upper face of the light-shielding film 33' is ground and flattened by a polishing/grinding techniques such as chemical machinery polishing to remove the light-shielding film 33' on the valid pixel region R11. At this time, the light-shielding film 33' having a constant thickness remains in the OPB pixel region R12 (FIG. 6B). Thereby, the light-shielding film 33 for covering the OPB pixel region R12 can be formed.

Figure 6C:
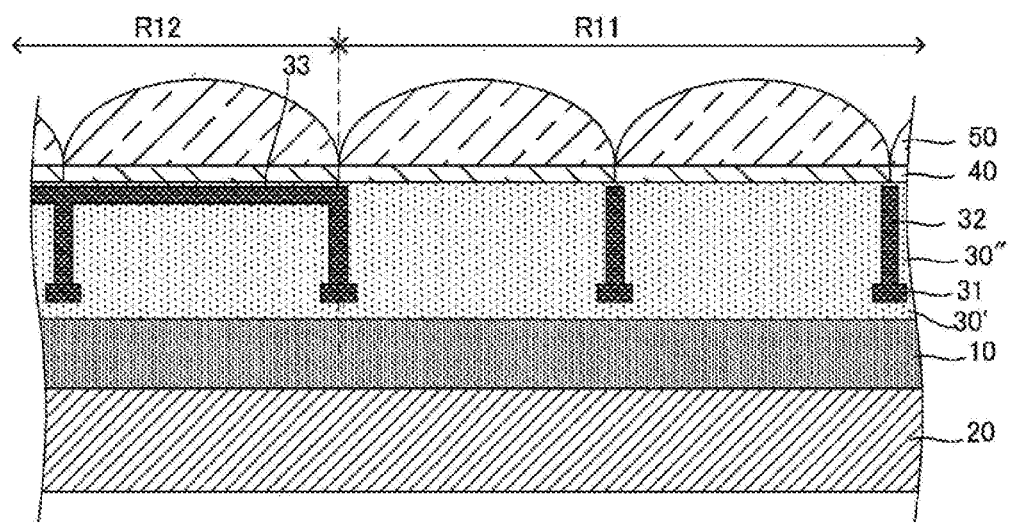

Subsequently, on the insulating layer 30" and the light-shielding film 33, a transparent insulating material such as SiO2 is thinly laminated to form an insulating layer 30'". The insulating layer 30'" is used as a capping layer. The insulating layers 30', 30", and 30'" constitute the insulating layer 30. In addition, the light-shielding film 31, the light-shielding wall 32, and the light-shielding film 33 are embedded in the insulating layer 30. On the insulating layer 30 formed in such a way, the color filter layer 40 and the on-chip lens layer 50 are formed (FIG. 6C).

Through the above steps, it is possible to produce the aforementioned solid-state imaging element 100 having the insulating layer 30 including the light-shielding portions such as the light-shielding film 31, the light-shielding wall 32, and the light-shielding film 33.

FIGS. 7A, 7B, 7C, 8A, 8B, 8C, and FIG. 8D are diagrams for explaining another example of the manufacturing method for the solid-state imaging element according to the first embodiment. Since the steps until the light-shielding film 33" is formed in the other manufacturing method are similar to the steps in the aforementioned manufacturing method, explanation of similar steps as in FIGS. 3A, 3B, 3C, and 3D will be omitted hereinafter, and for figures, illustrations of the similar steps as in FIGS. 3A, 3B, 3C, and 3D will be omitted.

Figure 7A:
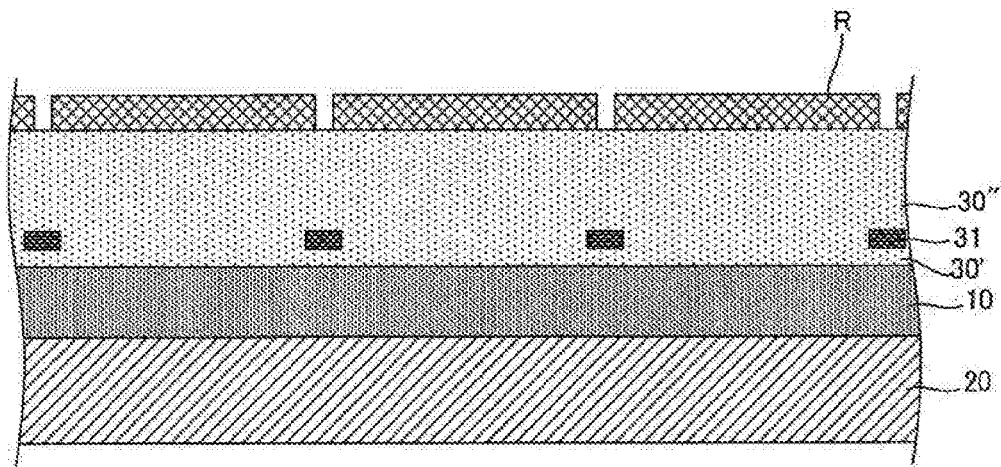
FIGS. 7A, 7B, and 7C are diagrams for explaining another example of the manufacturing method for the solid-state imaging element according to the first embodiment.
Figure 7B:
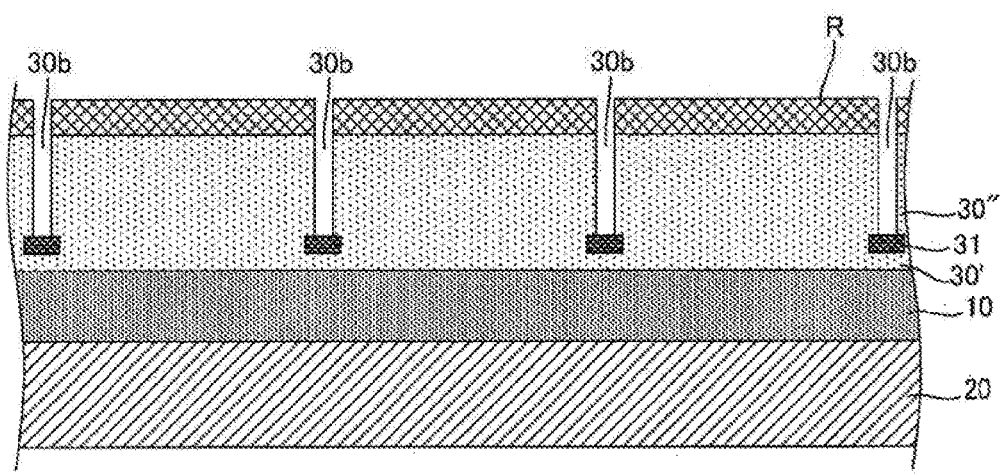
Figure 7C:
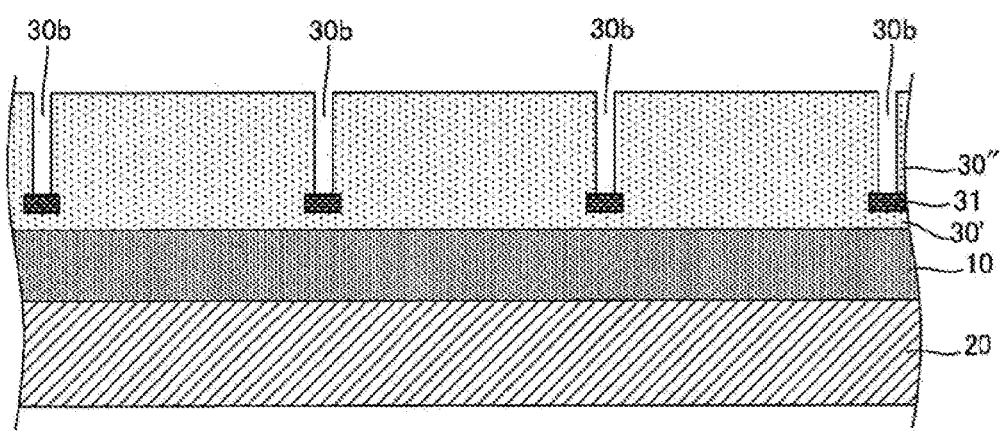

After the similar steps as in FIGS. 3A, 3B, 3C, and 3D, the vertical holes 30b having a depth reaching the upper face of the light-shielding film 31 along each boundary between the unit pixels PX on the insulating layer 30" are formed (FIGS. 7A, 7B, and 7C) in the present manufacturing method. The width of the vertical holes 30b is set so as to be substantially equal to the width of the light-shielding wall 32. Specifically, the resist R for covering the upper face of the insulating layer 30" excluding the range for forming the light-shielding wall 32 in plan view is formed by a photolithography (FIG. 7A). Subsequently, using the resist R as an etching mask, a portion along each boundary between the unit pixels PX is excavated by etching until the excavation reaches the light-shielding film 31 (FIG. 7B). Then, the resist R is removed to form the vertical holes 30b (FIG. 7C).

Figure 8A:
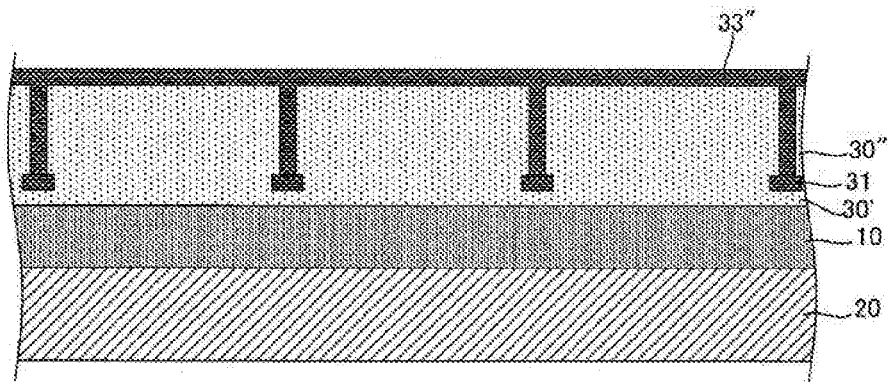
FIGS. 8A, 8B, 8C, and 8D are another diagrams for explaining another example of the manufacturing method for the solid-state imaging element according to the first embodiment.

Subsequently, structures as bases of the light-shielding wall 32 and the light-shielding film 33 are formed in the same step (FIG. 8A). Specifically, a light-shielding film 33' having a substantially constant thickness is formed on the upper face of the insulating layer 30" by laminating a film made of the aforementioned light-shielding material and the like on the insulating layer 30" having the vertical holes 30b. At this time, the light-shielding material is charged into the vertical holes 30b (FIG. 8A).

Subsequently, the light-shielding film 33' on the valid pixel region R11 is removed while the light-shielding film 33' on the OPB pixel region R12 is left, to complete the light-shielding wall 32 and the light-shielding film 33

Figure 8B:
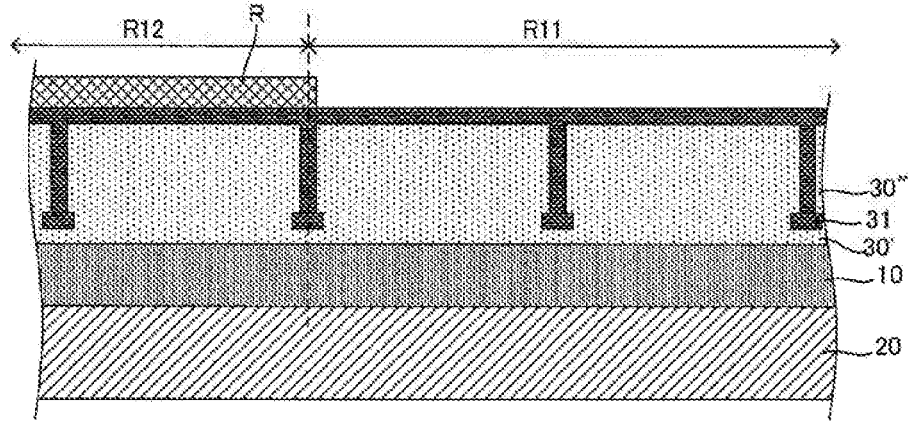
Figure 8C:
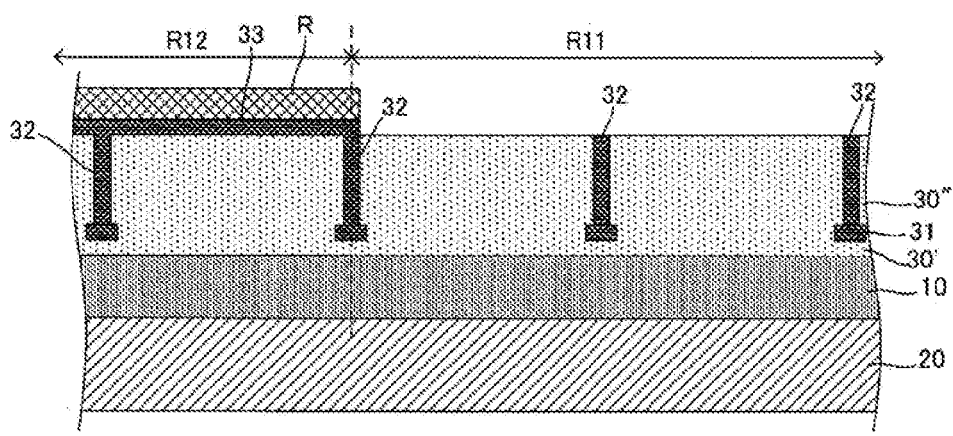
Figure 8D:
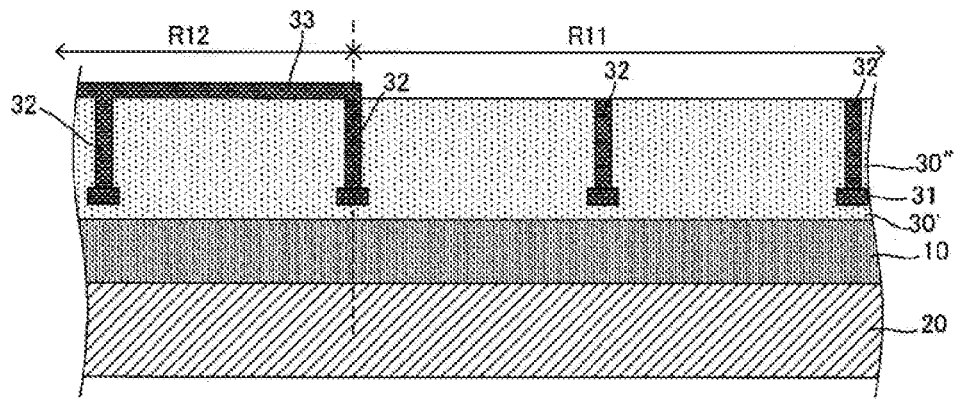

(FIGS. 8B, 8C, and 8D. Specifically, the resist R for covering the upper face of the light-shielding film 33' in the OPB pixel region R12 in plan view is formed by photolithography (FIG. 8B). Subsequently, the light-shielding film 33' in the valid pixel region R11 not covered with the resist R is excavated by etching until the insulating layer 30" is exposed (FIG. 8C). Then, the resist R is removed to form the light-shielding film 33 and the light-shielding wall 32 (FIG. 8D).

Subsequently, the insulating layer 30''' is formed on the insulating layer 30" and the light-shielding film 33 such that the light-shielding film 31, the light-shielding wall 32, and the light-shielding film 33 are embedded in the insulating layer 30, similarly to FIG. 6C. Finally, the color filter layer 40 and the on-chip lens layer 50 are formed on the insulating layer 30 (not illustrated in the figure).

Through the above steps, the aforementioned solid-state imaging element 100 can be produced with a smaller number of steps than in the manufacturing method explained in FIGS. 3A, 3B, 3C, 3D, 4A, 4B, 4C, 5A, 5B, 5C, 6A, 6B, and 6C. Furthermore, in any manufacturing method of FIG. 3A 3B, 3C, 3D, 4A, 4B, 4C, 5A, 5B, 5C, 6A, 6B, 6C, 7A, 7B, 7C, 8A, 8B, 8C, and 8D, the light-shielding film 33 and the light-shielding wall 32 can be simultaneously formed, and the manufacturing step can be simplified.

The light-shielding film 33 is placed in the vicinity of the color filter layer 40 of the OPB pixel, and the light-shielding film 31 having an opening portion is placed on the valid pixel P11 and the OPB pixel P12, so that the dark currents can be substantially equal between the valid pixel P11 and the OPB pixel P12. The black level can be defined and the noises can be reduced for the image signals to improve the image quality.

2. Second Embodiment

Figure 9:
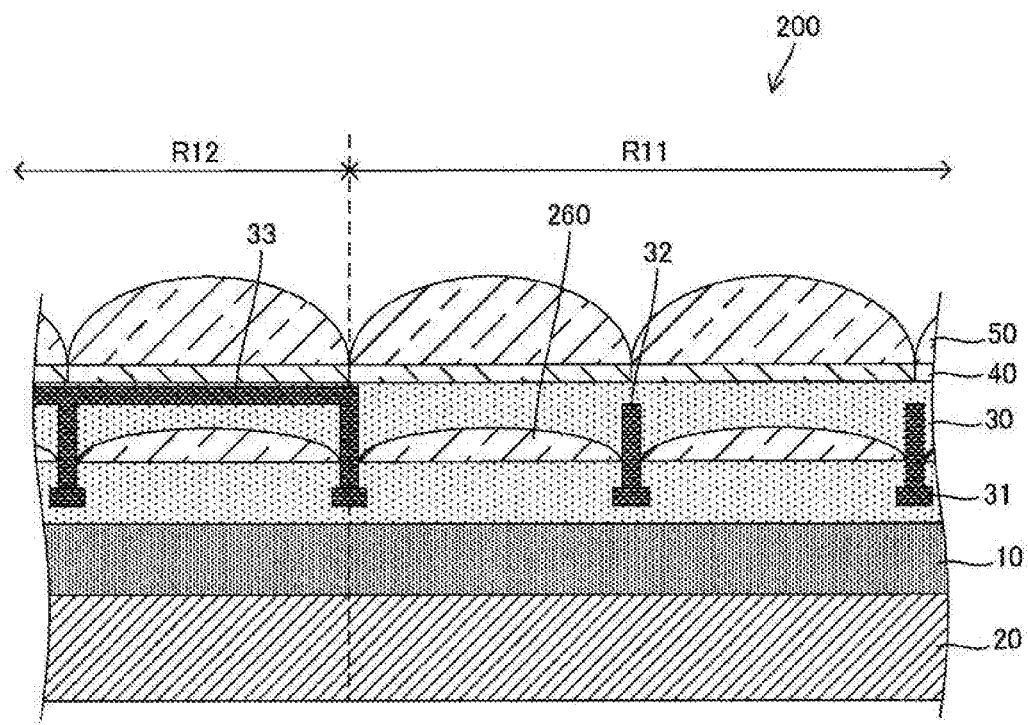
FIG. 9 is a diagram schematically depicting a schematic sectional structure of a solid-state imaging element according to a second embodiment.

FIG. 9 is a diagram schematically depicting a schematic sectional structure of a solid-state imaging element according to the second embodiment. Since a solid-state imaging element 200 depicted in FIG. 9 has a structure in which an SiN intralayer lens 260 is disposed in each unit pixel PX of the solid-state imaging element 100 according to the first embodiment, the configurations in common with configurations of the solid-state imaging element 100 are provided with the same symbols as in the first embodiment, and detailed explanations thereof are omitted.

The intralayer lens 260 is disposed below the light-shielding film 33 (on a side closer to the semiconductor substrate 10) in the insulating layer 30 of each unit pixel. The intralayer lens 260 can be made of, e.g. SiN.

This is because SiN acts as a hydrogen source, as described above. The intralayer lens 260 supplies hydrogen. When adopting a structure that the light-shielding film 33 is placed above the intralayer lens 260, hydrogen supplied from the intralayer lens 260 diffuses toward the semiconductor substrate 10 without inhibition. This makes it possible to achieve a structure that hardly causes variations in the amount of hydrogen supplied to the semiconductor substrate 10 between the valid pixel P11 and the OPB pixel 12.

3. Third Embodiment

Figure 10:
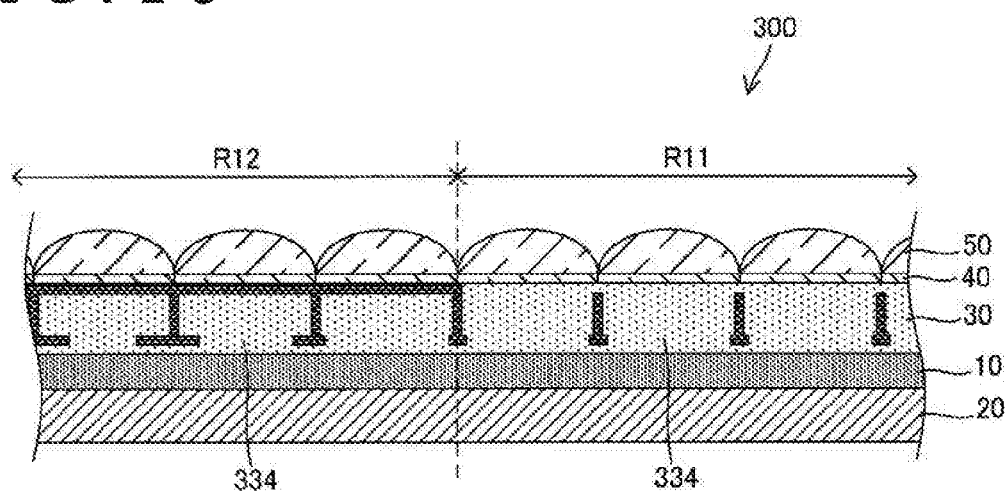
FIG. 10 is a diagram schematically depicting a schematic sectional structure of a solid-state imaging element according to a third embodiment.

FIG. 10 is a diagram schematically depicting a schematic sectional structure of a solid-state imaging element according to the third embodiment. A solid-state imaging element 300 depicted in FIG. 10 has a similar structure as that of the solid-state imaging element 100 according to the first embodiment, except for pixels in which a size of an opening 334 on the light-shielding film 31 is different from that in the solid-state imaging element 100. Thus, hereinafter, similar configurations as in the first embodiment are provided with the same symbols as in the first embodiment, and detailed explanations thereof are omitted.

As depicted in FIG. 10, for the respective pixels, the openings 334 on the valid pixels P11 have the same sizes and shapes, and have the substantially same shapes and structures between the hydrogen source in the insulating layer 30 and the semiconductor substrate 10. On the other hand, at least a part of the OPB pixel P12 (particularly, OPB pixel P12 close to the outer periphery in plan view) has the opening 334 smaller than the opening 334 on the valid pixel P11.

As described above, the OPB pixel region R12 is a rectangular region surrounding the outside of the valid pixel region R11 in plan view, and the peripheral circuit region R2 is provided outside the OPB pixel region R12. The peripheral circuit region R2 also includes the hydrogen source. Hereinafter, the hydrogen source in the peripheral circuit region R2 is referred to as an external hydrogen source, and the hydrogen source in the unit pixel is referred to as an internal hydrogen source.

If supply of hydrogen to the semiconductor substrate 10 is insufficient, the termination with hydrogen is not properly performed, resulting in increase of the dark current. On the other hand, excessive supply of hydrogen leads to inactivation of boron that is an impurity introduced into the semiconductor substrate 10, resulting in deterioration of dark current characteristics. For this reason, hydrogen should be supplied in an appropriate amount. In the OPB pixel P12 to which hydrogen is supplied from the external hydrogen source, the amount of hydrogen supplied from the internal hydrogen source to the semiconductor substrate 10 of the OPB pixel P12 can be decreased by reducing the opening 334 of the light-shielding film 31.

When the amount of the hydrogen supplied from the internal hydrogen source is decreased, a total amount of hydrogen supplied from the external hydrogen source and the internal hydrogen source can be brought close to the amount of hydrogen supplied from the internal hydrogen source of the valid pixel P11 to the semiconductor substrate 10 in the valid pixel P11.

This makes it possible to reduce variations in the photoelectric conversion performance between the valid pixel P11 and the OPB pixel P12, and between the OPB pixels P12 in the imaging element.

Additionally, in the OPB pixels P12, the opening 334 of the OPB pixel P12 (second OPB pixel) disposed away from the valid pixel region R11 can be narrowed compared to that of the OPB pixel P12 (first OPB pixel) close to the valid pixel region R11. At this time, the size of the opening 334 of the light-shielding film 31 can be adjusted so as to become narrower as the distance from the valid pixel region R11 increases. The size of the opening 334 is fluctuated depending on the amount of hydrogen supplied from the external hydrogen source to each OPB pixel P12, so that the total amount of hydrogen supplied from the external hydrogen source and the internal hydrogen source in the OPB pixel P12 can be adjusted. Thereby, the amount of hydrogen supplied to the semiconductor substrate 10 in the OPB pixel P12 can be adjusted to be the same as an amount of hydrogen supplied from the internal hydrogen source of the valid pixel P11 to the semiconductor substrate 10 of the valid pixel P11.

Figure 11:
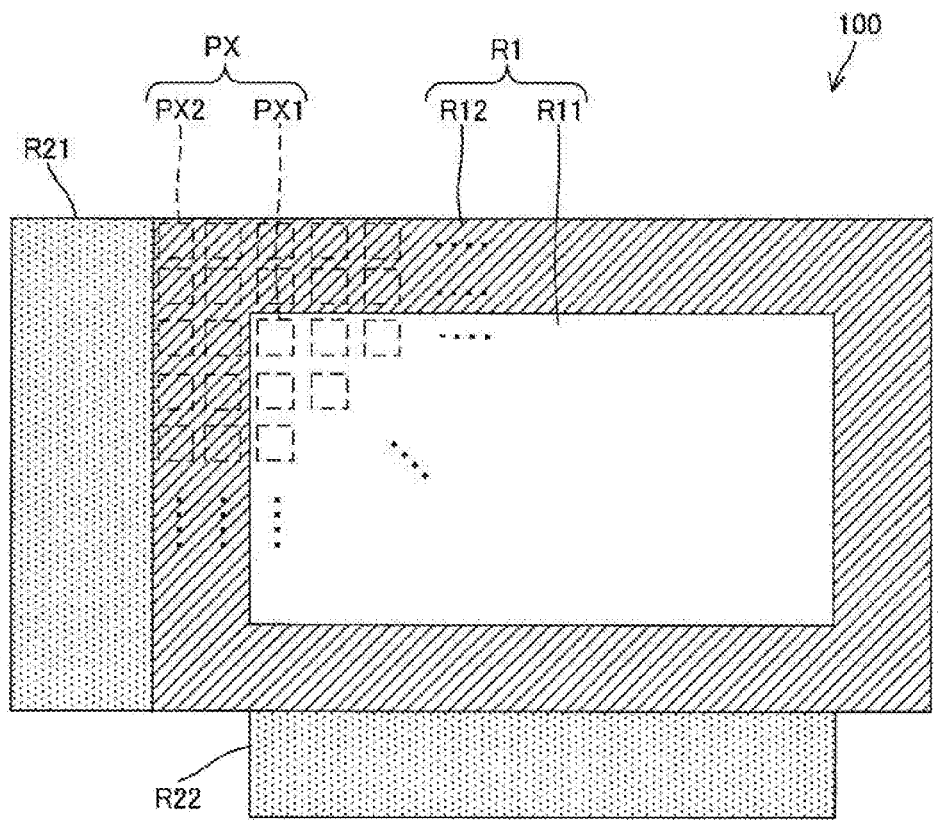
FIG. 11 is a diagram depicting a pixel array of the solid-state imaging element according to the third embodiment in plan view.

FIG. 11 is a diagram depicting a pixel array of the solid-state imaging element according to the third embodiment in plan view. Unlike the solid-state imaging element 100 explained in FIG. 2, the solid-state imaging element 100 in FIG. 11 includes peripheral circuit regions R21 and R22 instead of the peripheral circuit region R2. The peripheral circuit regions R21 and R22 supply different amounts of hydrogen. Herein, it is assumed that an amount of hydrogen supplied from the peripheral circuit region R22 is larger than that from the R21. In this case, the opening 334 of the light-shielding film 31 of the OPB pixel P12 adjacent to the R22 is narrowed compared to that of the OPB pixel P12 adjacent to the R21. Thereby, the amounts of hydrogen supplied from the external hydrogen sources can be substantially equal.

As a result, variations in the photoelectric conversion performance between the valid pixel P11 and the OPB pixel P12 in the imaging element can be further reduced.

4. Fourth Embodiment

Figure 12A:
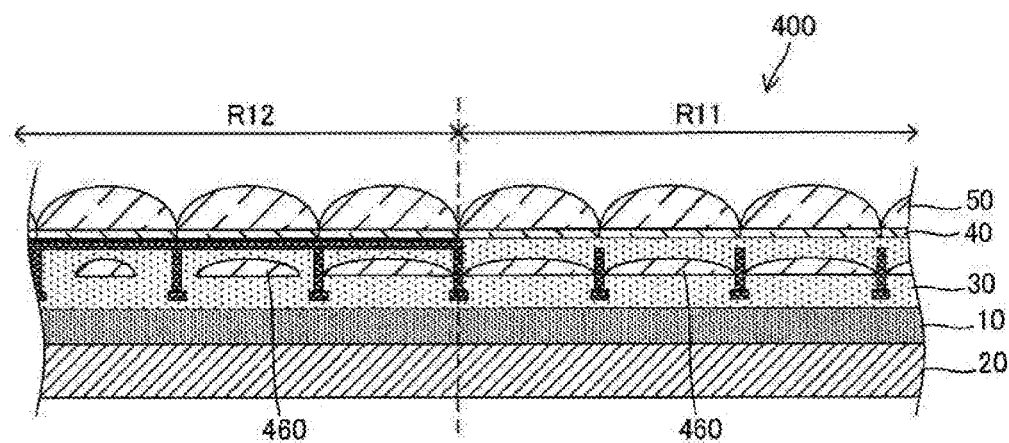
FIGS. 12A and 12B are diagrams schematically depicting a schematic sectional structure of a solid-state imaging element according to a fourth embodiment.
Figure 12B:
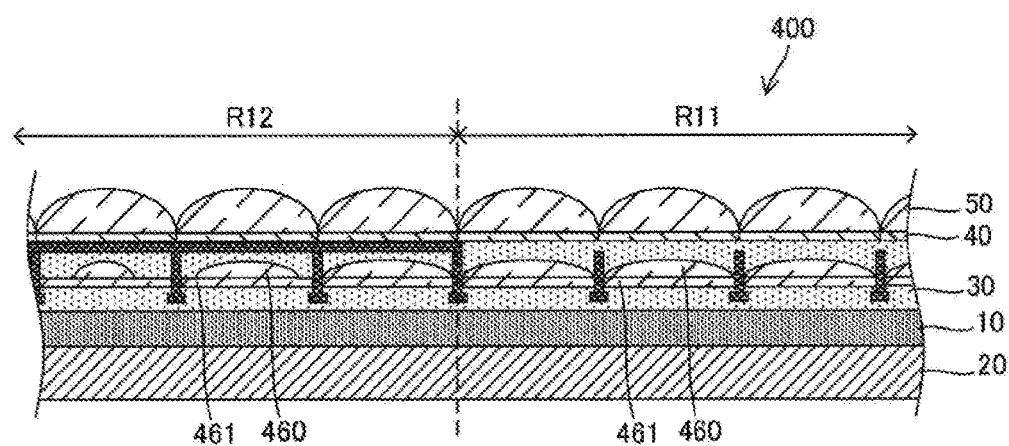

FIGS. 12A and 12B are diagrams schematically depicting a schematic sectional structure of a solid-state imaging element according to the fourth embodiment. A solid-state imaging element 400 depicted in FIGS. 12A and 12B has a similar structure as that of the solid-state imaging element 100 according to the first embodiment except for pixels in which a size of the structure as the hydrogen source is different from that in the solid-state imaging element 100. Thus, hereinafter, similar configurations as in the first embodiment are provided with the same symbols as in the first embodiment, and detailed explanations thereof are omitted.

In FIGS. 12A and 12B, among the valid pixels P11, sizes and shapes of the structures as the hydrogen sources are substantially equal, meanwhile at least some of the OPB pixels P12 have the structures as the hydrogen sources with sizes and shapes smaller than those of the valid pixels P11. Incidentally, examples of the structure as the hydrogen source in the pixel include, but are not limited to, an intralayer lens 460. Furthermore, in FIGS. 12A and 12B, sizes of the openings on the light-shielding film 31 are substantially equal between the valid pixel P11 and the OPB pixel P12. FIG. 12A illustrates an example of the intralayer lens 460 disposed in the insulating layer 30, and FIG. 12B illustrates an example of the intralayer lens 460 disposed adjacent to a center of a flat pedestal-like region 461. For example, a remaining region after forming a hemispherical lens region with the intralayer lens material for forming the intralayer lens 460 by dry etching can be applied to the region 461. In this case, the region 461 is made of the same material as that for the intralayer lens. Incidentally, the pedestal-like region 461 can be made of a material different from that for the intralayer lens 460.

As described above, the OPB pixel region R12 is a rectangular region surrounding the outside of the valid pixel region R11 in plan view, and the peripheral circuit region R2 is provided outside the OPB pixel region R12. The peripheral circuit region R2 also includes a structure as a hydrogen source in a heating step.

In the OPB pixel P12 to which hydrogen is supplied from the external hydrogen source, a size of the internal hydrogen source is decreased compared to that of the pixel to which hydrogen is not supplied from the external hydrogen source, so that an amount of hydrogen supplied from the internal hydrogen source to the semiconductor substrate 10 of the OPB pixel P12 is decreased.

When the amount of hydrogen supplied from the internal hydrogen source is decreased, the total amount of hydrogen supplied from the external hydrogen source and the internal hydrogen source is close to the amount of hydrogen supplied from the internal hydrogen source in the valid pixel P11 to the semiconductor substrate 10 in the valid pixel P11. This makes it possible to reduce variations in the photoelectric conversion performance between the valid pixel P11 and the OPB pixel P12, and between the OPB pixels P12 in the imaging element.

Additionally, the OPB pixel P12 may be adjusted such that the OPB pixel P12 as the second OPB pixel is disposed far from the valid pixel region R11, and the size of the internal hydrogen source is small, compared to that in the OPB pixel P12 as the first OPB pixel close to the valid pixel region R11. The size of the internal hydrogen source is fluctuated depending on the amount of hydrogen supplied from the external hydrogen source to each OPB pixel P12, so that the total amount of hydrogen supplied from the external hydrogen source and the internal hydrogen source can be adjusted. Thereby, the amounts of hydrogen supplied to the semiconductor substrate 10 in the OPB pixel P12 and the valid pixel P11 can be adjusted so as to be closer to each other.

In addition, in a case that the external hydrogen sources (peripheral circuit regions R21 and R22) having different hydrogen supply amounts are disposed like the solid-state imaging element 100 explained in FIG. 11, the sizes of the internal hydrogen sources can be changed according to the amounts of hydrogen supplied from these external hydrogen sources.

Needless to say, the total amount of hydrogen supplied to the semiconductor substrate 10 may be adjusted to be uniform for each pixel, by combining the technique of adjusting the size of the internal hydrogen source according to the fourth embodiment and the technique of adjusting the size and shape of the opening according to the fourth embodiment.

Note that the configuration of the solid-state imaging element 400 according to the fourth embodiment is not limited to this example. For example, the closer the OPB pixel P12 is to the valid pixel, the larger the size of the internal hydrogen source can be. In addition, the size of the internal hydrogen source can be selected regardless of a distance from the valid pixel. In addition, the internal hydrogen source can be shaped in various forms other than the intralayer lens 460. For example, the internal hydrogen source can be shaped in a polygon such as a square in plan view. In addition, the internal hydrogen source can also be configured in a periodically arranged meshed or striped shape. Furthermore, the mesh or stripe can be configured in an aperiodic arrangement. These shapes and the like can be adjusted by a desired hydrogen supply amount.

5. Fifth Embodiment

Figure 13A:
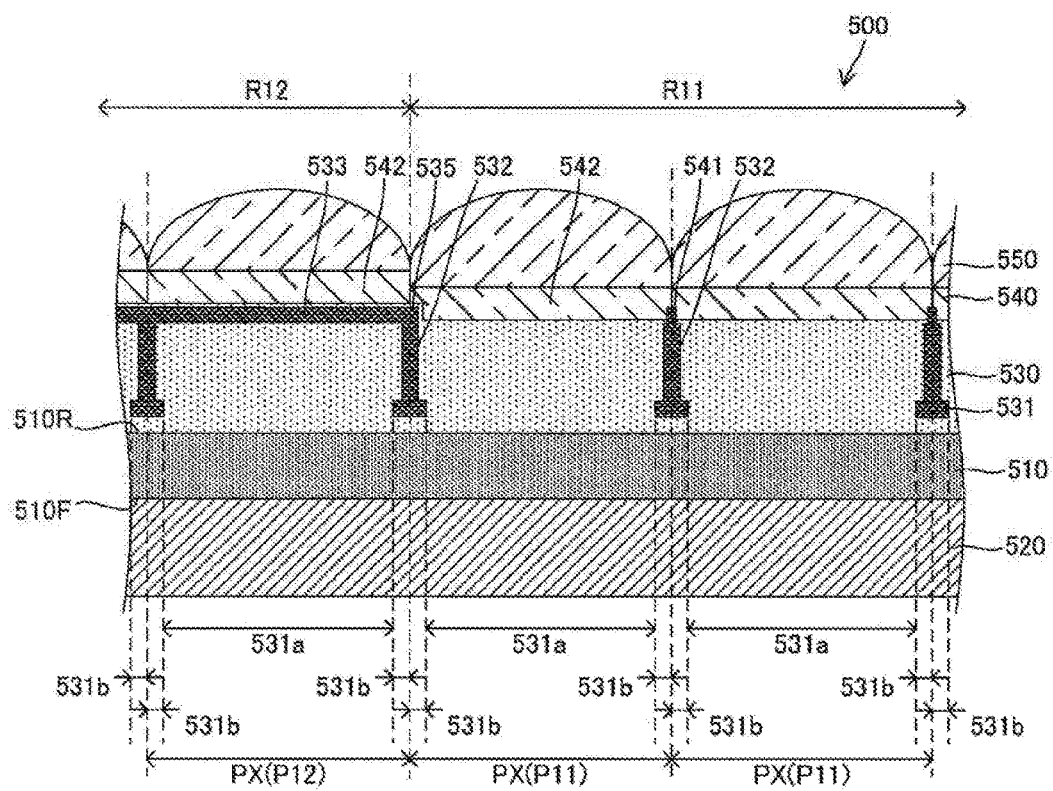
FIGS. 13A and 13B are diagrams schematically depicting a schematic sectional structure of a solid-state imaging element according to a fifth embodiment.
Figure 13B:
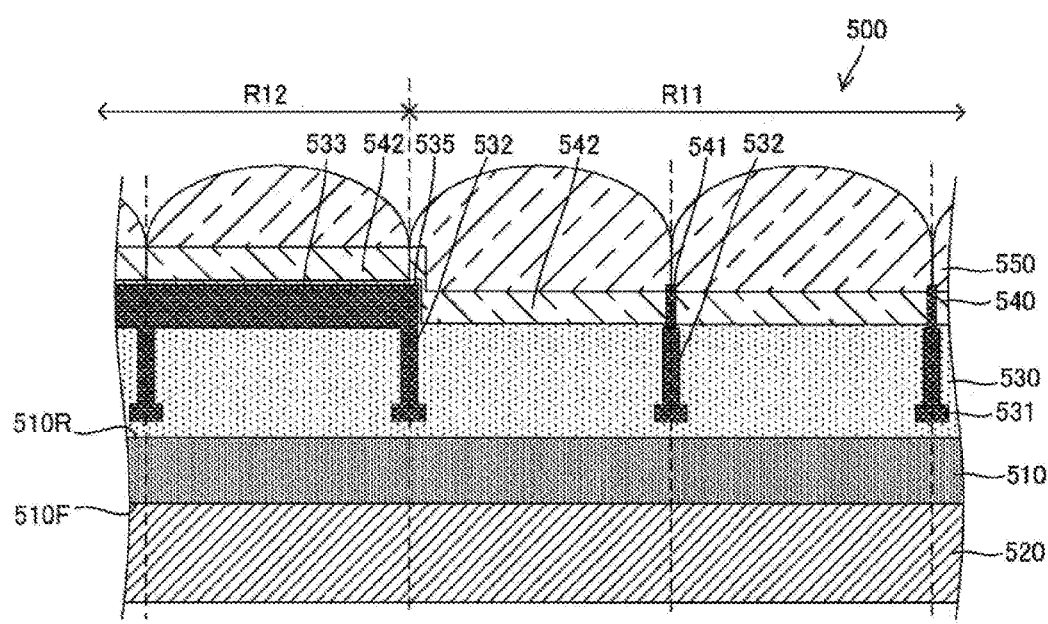

FIGS. 13A and 13B are diagrams schematically depicting a schematic sectional structure of a solid-state imaging element according to the fifth embodiment. The solid-state imaging element 500 is a back-illuminated type CMOS imaging element. Note that, hereinafter, the upper and lower directions in FIGS. 13A and 13B are phrased as "upper side/lower side" in some cases, and furthermore, in each configuration depicted in FIGS. 13A and 13B, the upper side is referred to as a backside face, and the lower side is referred to as a top face, in some cases.

In the solid-state imaging element 500, a wiring layer 520 is laminated on one face (top face 510F) of a semiconductor substrate 510. In addition, an insulating layer 530, a color filter layer 540, and an on-chip lens layer 550 are sequentially laminated on the other face (backside face 510R) of the semiconductor substrate 510. Incidentally, another layer may be laminated between the semiconductor substrate 510 and each layer.

The wiring layer 520 has a configuration of a multi-layered wiring layer, including: a plurality of conductive layers constituting wirings, electrodes and the like; an intralayer insulating layer for insulating between the conductive layers; and a contact penetrating the intralayer insulating layer to connect between the conductive layers. The wiring layer 520 is appropriately connected with pixel transistors (transfer transistor, selection transistor, amplification transistor, reset transistor, and the like) formed on the semiconductor substrate 510.

As the semiconductor substrate 510, e.g. a semiconductor substrate body such as a silicon substrate; a compound semiconductor; and other semiconductor substrate bodies applied to general solid-state imaging elements can be used.

In the semiconductor substrate 510, an impurity diffusion layer (not illustrated in the figure) constituting source/drain regions of an MOS transistor constituting the pixel transistor, a photodiode (not illustrated in the figure), and the like are disposed on the top face 510F side facing the wiring layer 520. In the wiring layer 520 covering a portion as a channel between the source/drain regions of the MOS transistor, a gate electrode (not illustrated in the figure) of the MOS transistor is formed via a gate insulating film. The photodiode generates electric charges (electron/hole pair) corresponding to lights incident from the backside face 510R side of the semiconductor substrate 510.

The semiconductor substrate 510 includes a plurality of unit pixel regions corresponding to each unit pixels PX. Each unit pixel PX has a photoelectric conversion element such as a photodiode. For example, in a case of the semiconductor substrate 510 made of a single crystal silicon, a photoelectric conversion element (photodiode) composed of a high-concentration N-type semiconductor region is formed. The photoelectric conversion elements of the unit pixels PX adjacent to each other are partitioned by element-separating regions made of a P-type semiconductor extending in a thickness direction of the semiconductor substrate 510.

The insulating layer 530 is transparent and has a constant thickness. In the insulating layer 530, in the vicinity of the semiconductor substrate 510 of the insulating layer 530 on the boundary between the unit pixels, a light-shielding film 531 is formed as a flat layer extending substantially parallel to the backside face 510R of the semiconductor substrate 510. Furthermore, a light-shielding wall 532 is formed as a partition-like partitioning wall extending in a thickness direction of the solid-state imaging element 500 along the pixel boundary between the unit pixels PX on the insulating layer 530. Note that, in the OPB pixel in FIGS. 13A and 13B, a light-shielding film 533 is illustrated at a similar vertical-direction level as in the first to fourth embodiments described above, but the vertical-direction level of the light-shielding film 533 can be optionally changed.

The light-shielding portions such as the light-shielding film 531 and the light-shielding wall 532 are made of the aforementioned light-shielding material and the like. As necessary, surfaces of the light-shielding portions formed of these metal materials are configured to be covered with a barrier metal film.

Regarding the light incidence from the insulating layer 530 in the unit pixel to the photoelectric conversion element of the semiconductor substrate 510, the light-shielding film 531 has a light-receiving region 531a and a light-shielding region 531b. For each unit pixel, light can be incident on the photoelectric conversion element of the semiconductor substrate 510 from the insulating layer 530 in the light-receiving region 531a where the light-shielding film 531 is not formed. On the other hand, in the light-shielding region 531b where the light-shielding film 531 is formed, light incident on the photoelectric conversion element of the semiconductor substrate 510 from the insulating layer 530 is shielded.

The semiconductor substrate 510-side end portion of the light-shielding wall 532 is formed in contact with the backside face of the light-shielding film 531, and the color filter layer 540-side end portion of the light-shielding wall 532 is formed in the vicinity of or in contact with the surface of the color filter layer 540. The light-shielding wall 532 prevents color mixture caused by light incident on the adjacent unit pixel in the transparent insulating layer 530.

On the light-shielding wall 532, a light-shielding wall 541 as a fourth light-shielding portion having a height protruding into the color filter layer 540 and having a width smaller than that of the light-shielding wall 532 is laminated. The light-shielding wall 541 bears a positional relationship that at least a part of the light-shielding wall 541 overlaps the light-shielding wall 532 in the width direction of the light-shielding wall 532 (horizontal direction in the figure). That is, as long as the light-shielding wall 541 partially overlaps the light-shielding wall 532 in the width direction of the light-shielding wall 532 (the horizontal direction in the figure), the other part need not overlap. The light-shielding wall 541 can have, for example, a two-layer structure in which a titanium layer also functioning as a barrier metal is laminated on the light-shielding wall 532, and a tungsten layer is laminated on the titanium layer.

The color filter layer 540 has a partitioned structure in which a range corresponding to each unit pixel is surrounded by the light-shielding wall 541 in plan view. In other words, a color filter 542 is shaped so as to be embedded in a compartment surrounded by the light-shielding wall 541. As illustrated in FIG. 13A, the color filter 542 can have a thickness equal to or higher than that of the light-shielding wall 541 in the vertical direction. On the other hand, as illustrated in FIG. 13B, the color filter 542 can have a thickness lower than the height of the light-shielding wall 541. In any case, at least the lower part of the color filter 542 is embedded in the light-shielding wall 541. For this reason, at least on the lower part of the color filter 542, light obliquely incident through the adjacent color filter 542 is shielded by the light-shielding wall 541. In such a way, the light-shielding wall 541 extends to a region adjacent to the light-shielding wall 532 and having the color filter layer 540 disposed between the unit pixels PX, to shield light transmitted through the color filter of the adjacent pixel. Thereby, the image quality can be improved.

Of the light-shielding wall 541, at least a part in a width direction only needs to be positioned on the light-shielding wall 532, and a width-direction midpoint of the light-shielding wall 541 may be different from a width-direction midpoint of the light-shielding wall 532. That is, the light-shielding walls may be formed in such a way that the partition range of the light-shielding wall 541 indicating the unit pixel range in the color filter layer 540, and the partition range of the light-shielding wall 541 indicating the unit pixel range in the insulating layer 530 may deviate from each other. Thereby, the light-shielding wall 541 effectively functions also in, e.g. a configuration utilizing what is generally called a pupil correction performed by deviating centers of the photodiode, the color filter, and the on-chip lens constituting one unit pixel.

The color filter material of the color filter layer 540, and the light-shielding wall 541 and the lower layer members (insulating layer 530, light-shielding wall 532, and the like) are separated by a cap layer 535 which has a substantially uniform thickness, and is overall laminated, and made of $SiO_2$. Incidentally, the cap layer 535 is not required to be formed over the entire surface, and a part of the cap layer 535 can be omitted.

FIGS. 14A, 14B, 14C, 14D, 15A, 15B, 15C, 16A, 16B, 16C, 17A, and 17B are diagrams for explaining an example of the manufacturing method for the solid-state imaging element according to the fifth embodiment.

Figure 14A:
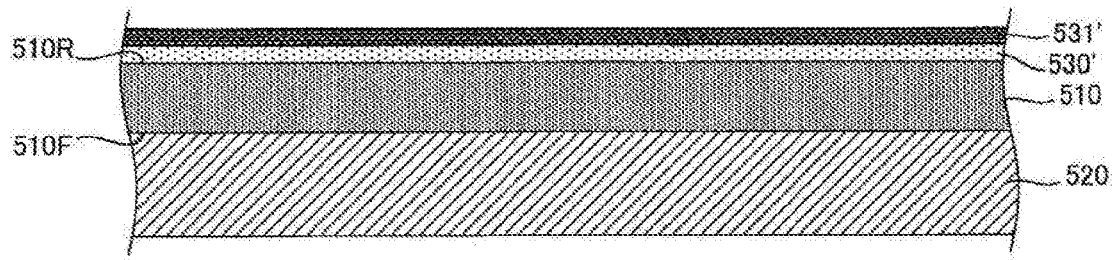
FIGS. 14A, 14B, 14C, and 14D are diagrams for explaining an example of a manufacturing method for the solid-state imaging element according to the fifth embodiment.

First, an insulating layer 530' formed by laminating a thin transparent insulating material such as SiO2 is placed on the backside face 510R of the semiconductor substrate 510 on which the wiring layer 520 is laminated on the top face 510F side. Next, a light-shielding film 531' made of the aforementioned light-shielding material and the like and having a predetermined thickness is placed on the insulating layer 530' (FIG. 14A). The light-shielding film 531' only needs to have a thickness with a light shielding effect.

Figure 14B:
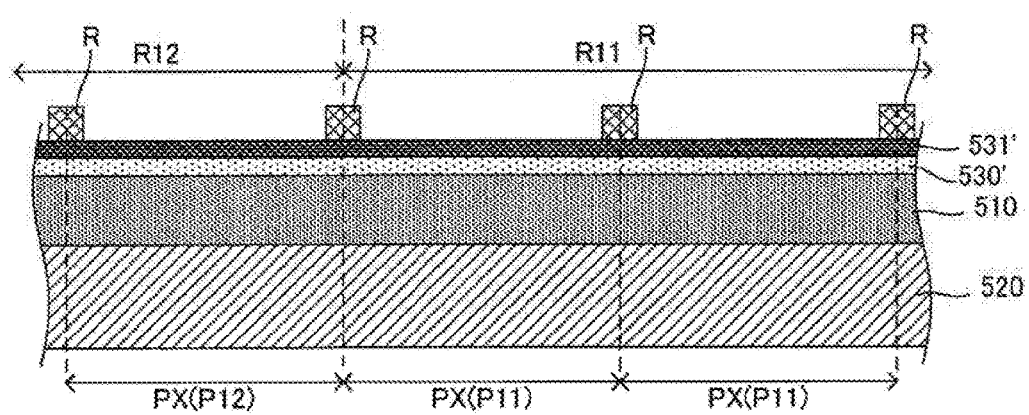
Figure 14C:
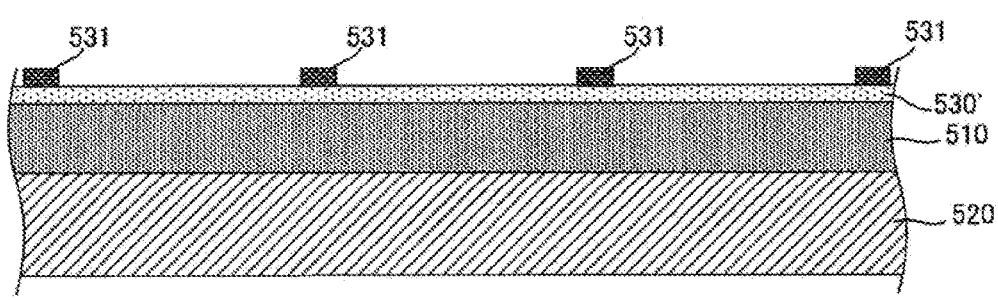

Next, the resist R as an etching mask is formed on the light-shielding film 531' by photolithography (FIG. 14B). The resist R is formed at the same position as that of the light-shielding film 531 formed with a constant width along the boundary between the unit pixels PX in plan view. Then, an unnecessary portion of the light-shielding film 531' is removed by etching while a portion corresponding to the light-shielding film 531 is left, and the resist R is removed to form the light-shielding film 531 (FIG. 14C).

Figure 14D:
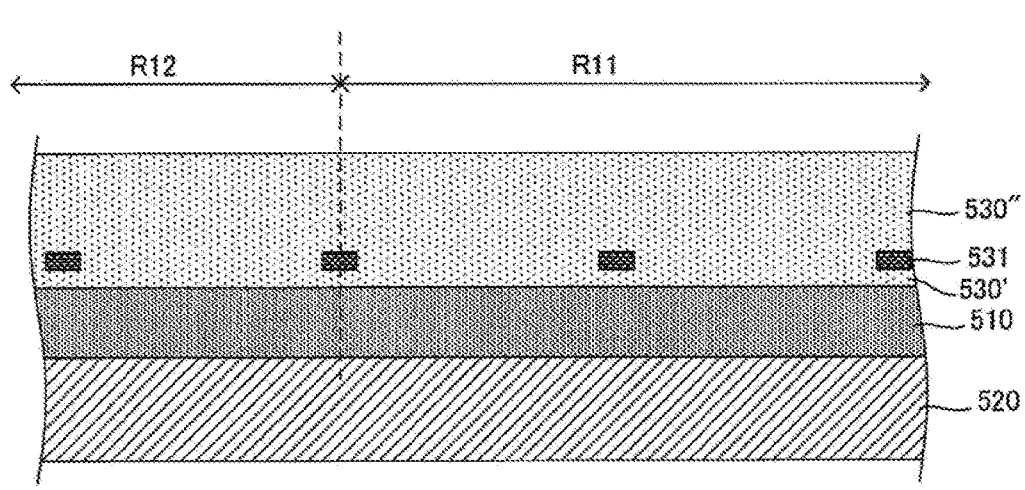

Next, the same transparent insulating material as that for the insulating layer 530', such as SiO2 is laminated on the light-shielding film 531 to form an insulating layer 530", and the light-shielding film 531 is embedded in the insulating layers 530' and 530" (FIG. 14D). A thickness of the insulating layer 530" can be substantially equal to the height of the light-shielding wall 532. If a surface of the insulating layer 530" is not flat, the surface is flattened by polishing/grinding techniques such as chemical machinery polishing.

Figure 15A:
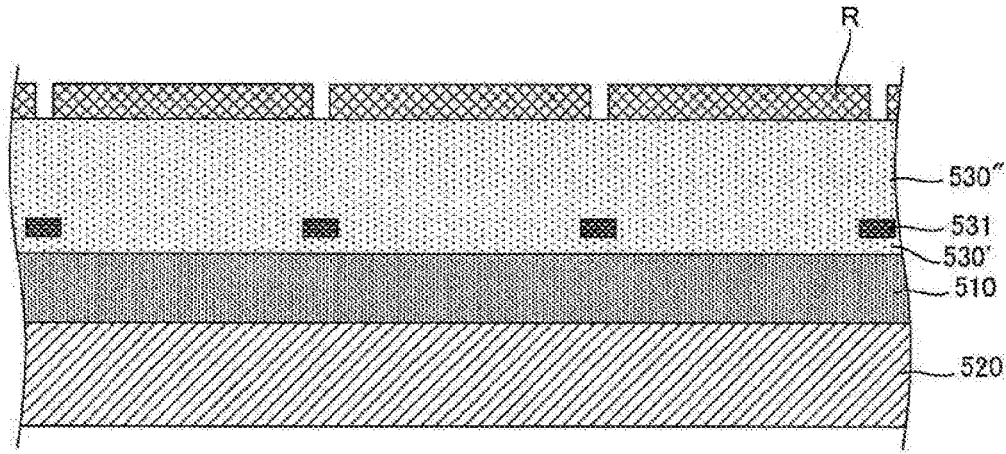
FIGS. 15A, 15B, and 15C are another diagrams for explaining an example of the manufacturing method for the solid-state imaging element according to the fifth embodiment.
Figure 15B:
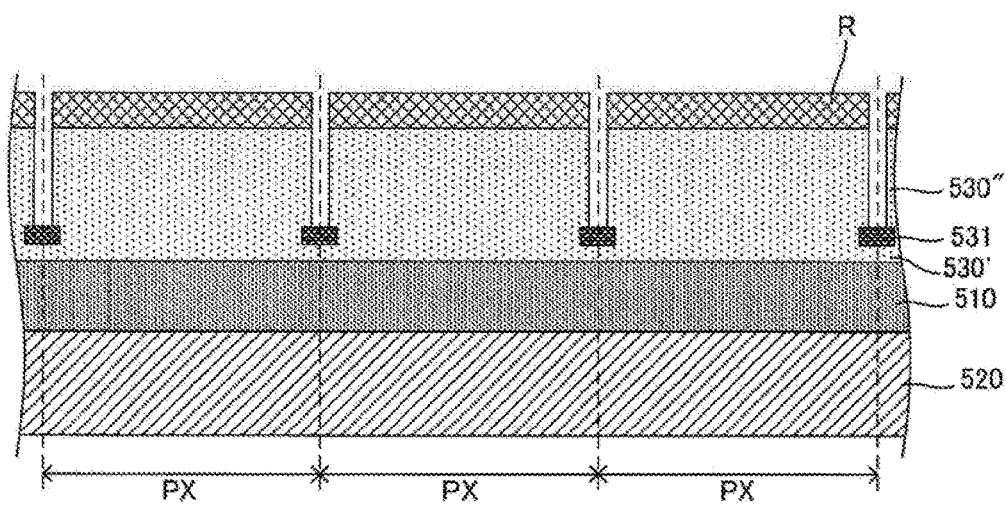
Figure 15C:
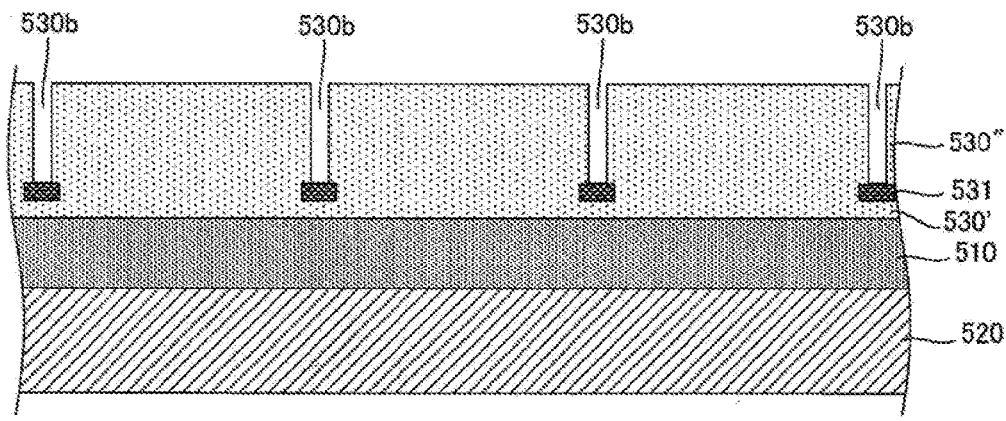

Next, vertical holes 530b having a depth reaching the upper face of the light-shielding film 531 are formed along each boundary between the unit pixels PX on the insulating layer 530" (FIGS. 15A, 15B, and 15C). A width of the vertical holes 530b can be substantially equal to the width of the light-shielding wall 532. Specifically, the resist R for covering the upper face of the insulating layer 530" excluding the range for forming the light-shielding wall 532 in plan view is formed (FIG. 15A). Subsequently, a portion along each boundary between the unit pixels PX is excavated by etching until the excavation reaches the light-shielding film 531 (FIG. 15B), to remove the resist R. Thereby, the vertical holes 530b can be formed (FIG. 15C).

Figure 16A:
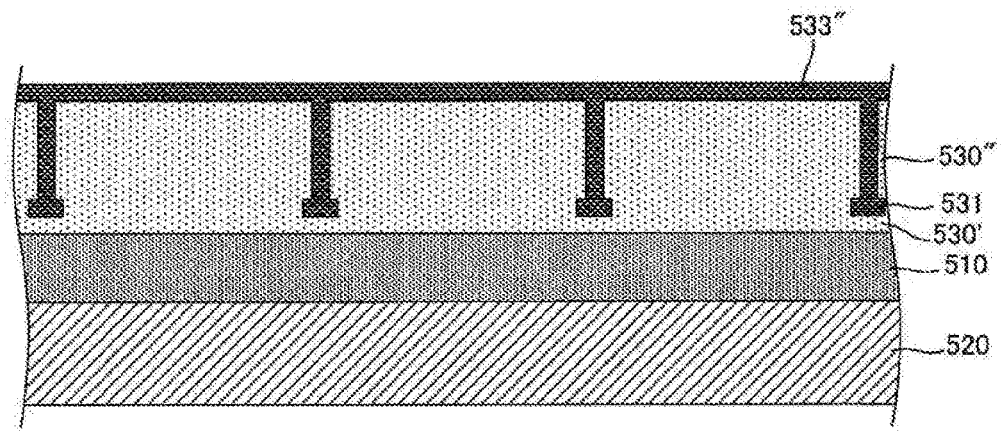
FIGS. 16A, 16B, and 16C are still another diagrams for explaining an example of the manufacturing method for the solid-state imaging element according to the fifth embodiment.

Subsequently, structures as bases of the light-shielding wall 532 and the light-shielding film 533 are formed in the same step (FIG. 16A). Specifically, a film made of the aforementioned light-shielding material and the like is laminated on the insulating layer 530" having the vertical holes 530b. The light-shielding material is charged into the vertical holes 530b, and the light-shielding film 533' made of a light-shielding material and having a constant thickness is formed on the upper face of the insulating layer 530" (FIG. 16A).

Figure 16B:
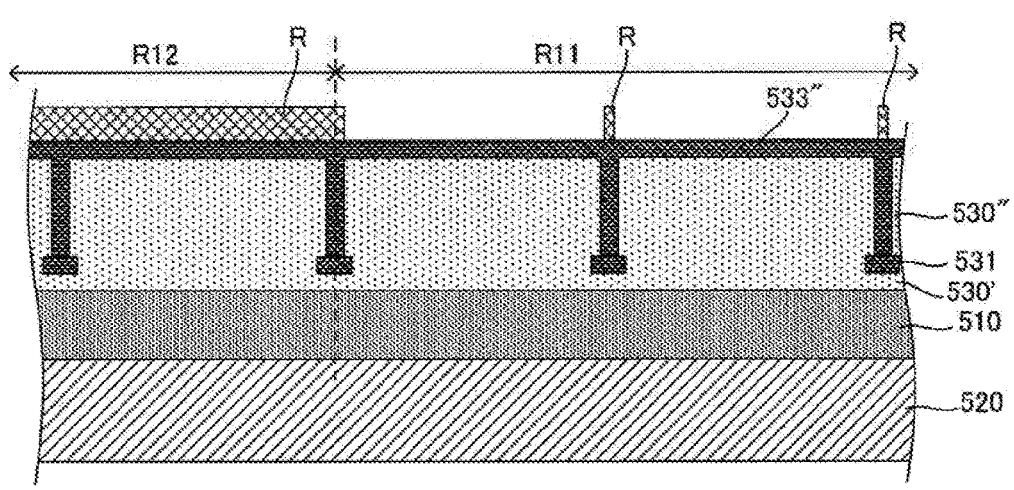
Figure 16C:
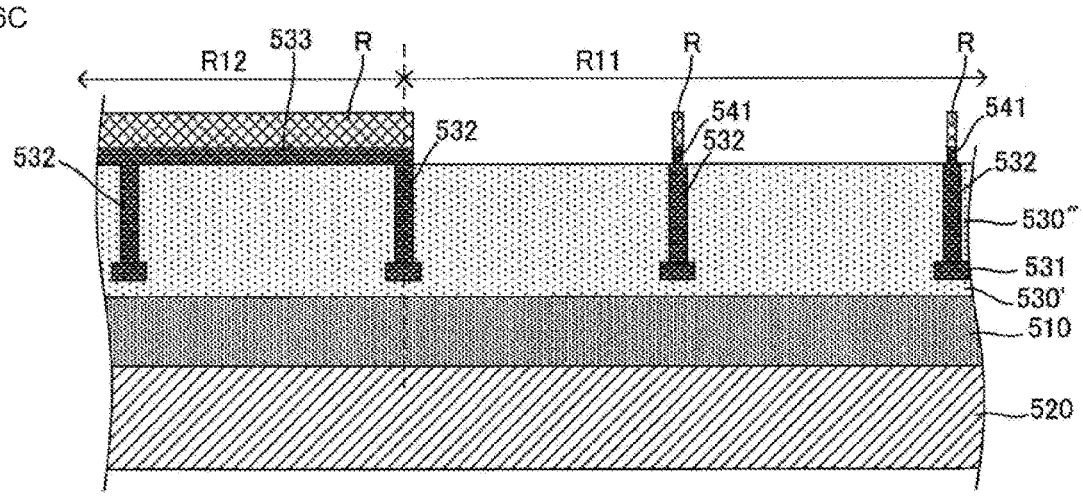
Figure 17A:
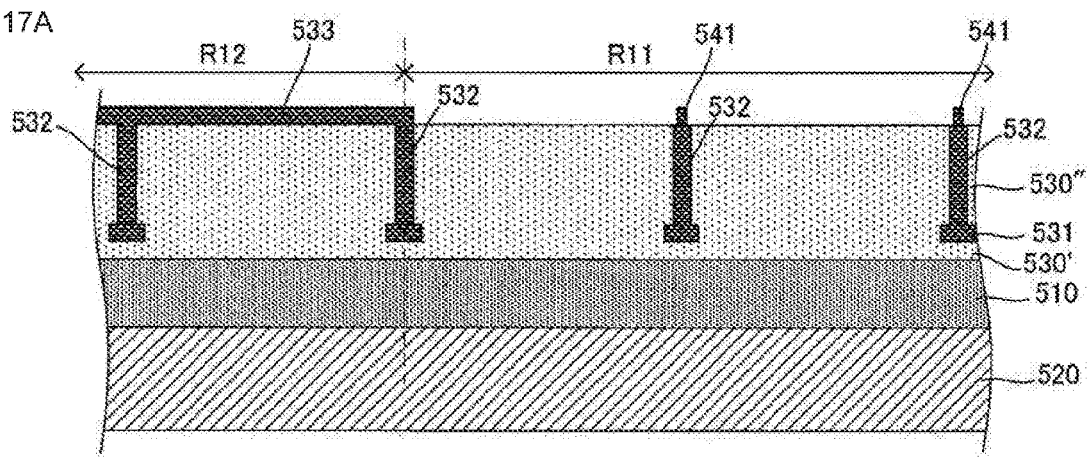
FIGS. 17A and 17B are further another diagrams for explaining an example of the manufacturing method for the solid-state imaging element according to the fifth embodiment.

Next, the light-shielding wall 532, the light-shielding film 533, and the light-shielding wall 541 are formed (FIGS. 16B, 16C, and 17A). They can be formed by removing the light-shielding film 533' other than the pixel boundary on the valid pixel region R11 while leaving the light-shielding film 533' on the OPB pixel region R12 and the light-shielding film 533' of the pixel boundary on the valid pixel region R11. Specifically, the resist R for covering the upper face of the light-shielding film 533' in the OPB pixel region R12 and the upper face of the light-shielding film 533' of the pixel boundary on the valid pixel region R11 in plan view is formed (FIG. 16B). Subsequently, the light-shielding film 533' in the valid pixel region R11 not covered with the resist R is removed by etching and excavated until the insulating layer 530" is exposed (FIG. 16C). Then, the resist R is removed to form the light-shielding wall 541 (FIG. 17A).

Figure 17B:
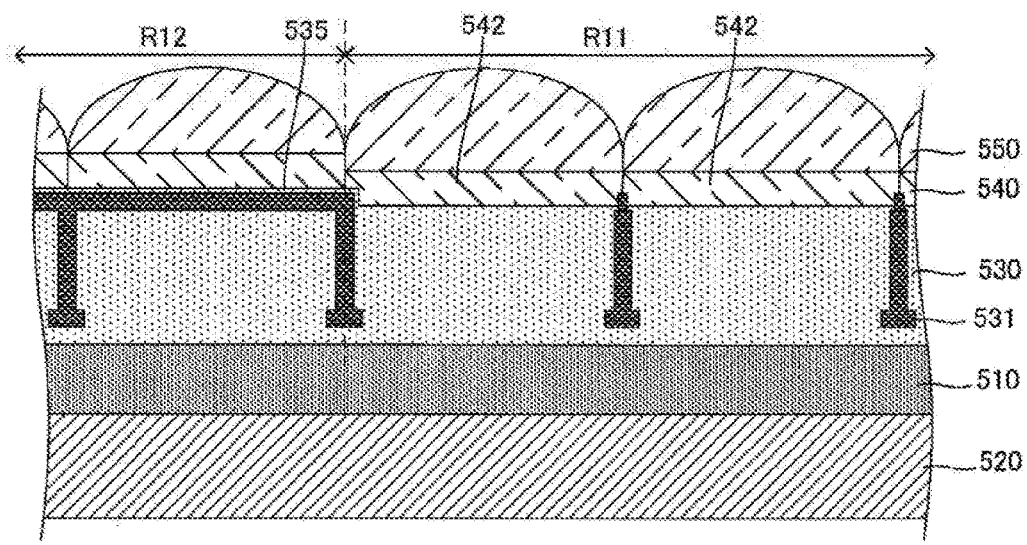

Subsequently, the cap layer 535 is uniformly laminated on the upper faces of the light-shielding film 533 and the insulating layer 530, on which the color filter layer 540 and the on-chip lens layer 550 are formed (FIG. 17B). At this time, at least the lower part of the color filter 542 of the color filter layer 540 is embedded in the partitioning wall of the light-shielding wall 541.

Through the above steps, the solid-state imaging element 100 including the light-shielding wall 541 can be produced. In addition, when the color filter layer 40 is removed by etching or the like and then custom reproduction for forming the color filter again is applied, an asking process or an etching residue-removing process is performed. Herein, for the etching residue-removing process, a process of removing the etching residue containing carbon by exposure to sulfuric acid/hydrogen peroxide can be applied. In these processes, the light-shielding wall 532 is dissolved and removed starting from a recess (seam) on the upper face of the light-shielding wall 532, resulting in a possibility of color mixture. However, when laminating the light-shielding wall 541 on the upper portion of the light-shielding wall 532, generation of seam can be suppressed to prevent color mixture.

6. Sixth Embodiment

Figure 18A:
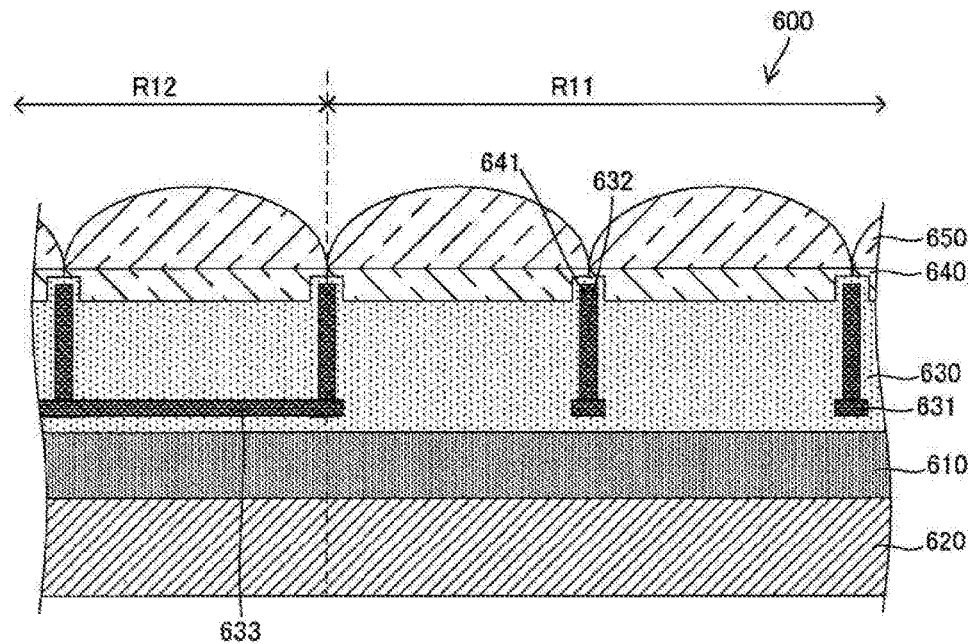
FIGS. 18A and 18B are diagrams schematically depicting a schematic sectional structure of a solid-state imaging element according to a sixth embodiment.
Figure 18B:
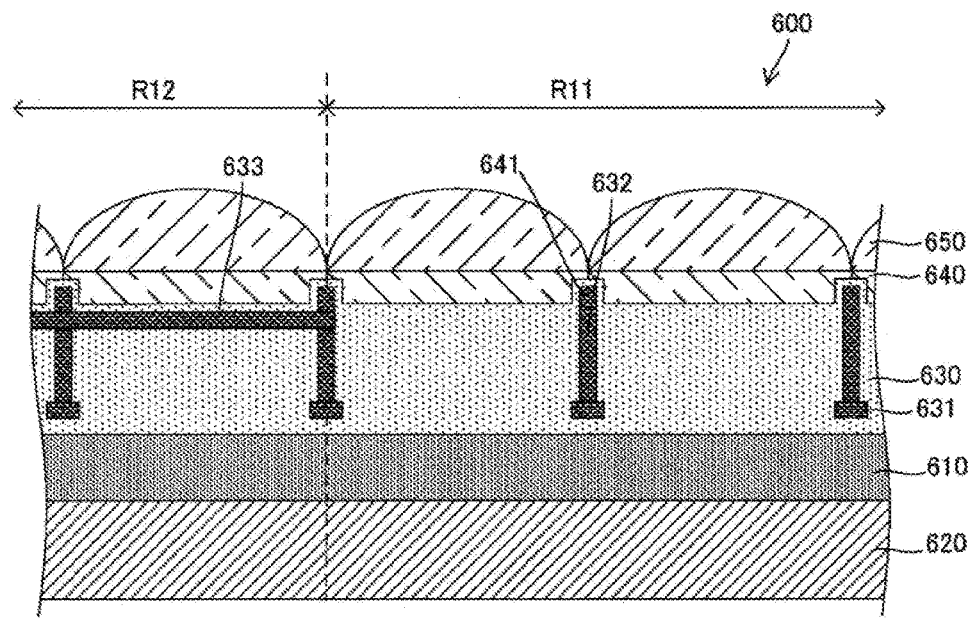

FIGS. 18A and 18B are diagrams schematically depicting a schematic sectional structure of a solid-state imaging element according to the sixth embodiment. A solid-state imaging element 600 depicted in FIGS. 18A and 18B has a similar structure as that of the solid-state imaging element 500 according to the fifth embodiment except that a structure and a shape of the light-shielding wall for partitioning the insulating layer and the color filter, and a position of the light-shielding film for covering the OPB pixel are different from those of the solid-state imaging element 500. Thus, hereinafter, similar configurations as those in the fifth embodiment are represented by symbols in the fifth embodiment, of which the head number is replaced with "6," and detailed explanations thereof are omitted. Note that FIG. 18A illustrates an example that a light-shielding film 633 is placed in the vicinity of a semiconductor substrate 610 in an insulating layer 630, and FIG. 18B illustrates an example that the light-shielding film 633 is placed in the vicinity of a color filter layer 640 in the insulating layer 630. In the case of FIG. 18B, since the light-shielding film 633 is placed in the vicinity of the color filter layer 640, amounts of hydrogen supplied from the insulating layer 630 can be substantially equal between the OPB pixel region R12 and the valid pixel region R11.

FIGS. 19A, 19B, 19C, 19D, 20A, 20B, 20C, 21A, 21B, 21C, 22A, 22B, and 22C are diagrams for explaining an example of a manufacturing method for the solid-state imaging element according to the sixth embodiment. In FIGS. 19A, 19B, 19C, and 19D, the manufacturing method for the solid-state imaging element according to the sixth embodiment is substantially similar to the aforementioned manufacturing method according to the fifth embodiment except for formation of light-shielding films 631 and 633, and therefore only differences will be explained. FIGS. 19A, 19B, 19C, 19D, 20A, 20B, 20C, 21A, 21B, 21C, 22A, 22B, and 22C illustrate a manufacturing method for the imaging element having the configuration depicted in FIG. 18A.

Figure 19A:
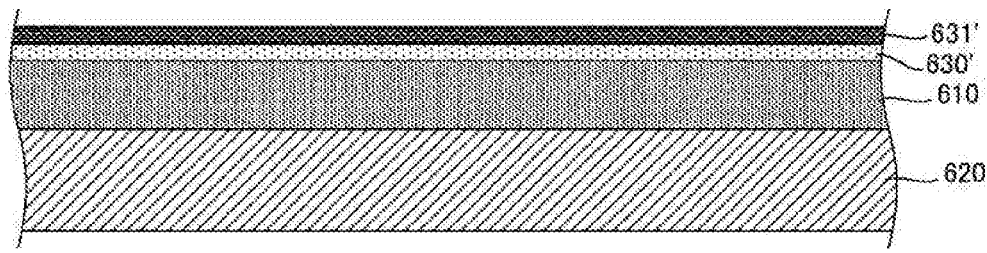
FIGS. 19A, 19B, 19C, and 19D are diagrams for explaining an example of a manufacturing method for the solid-state imaging element according to the sixth embodiment.
Figure 19B:
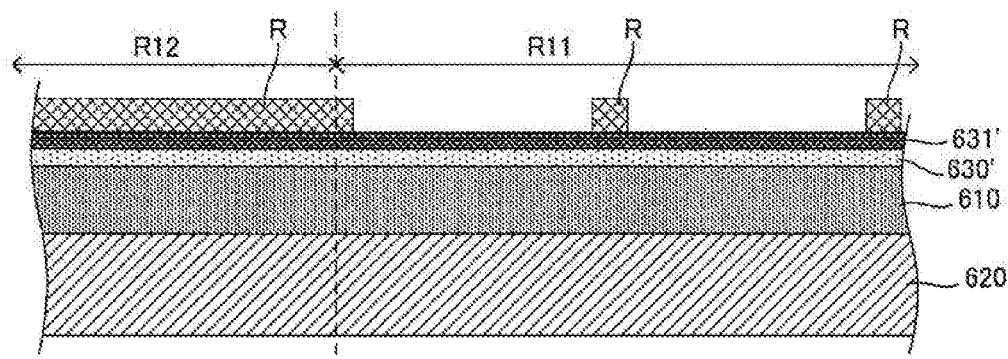
Figure 19C:
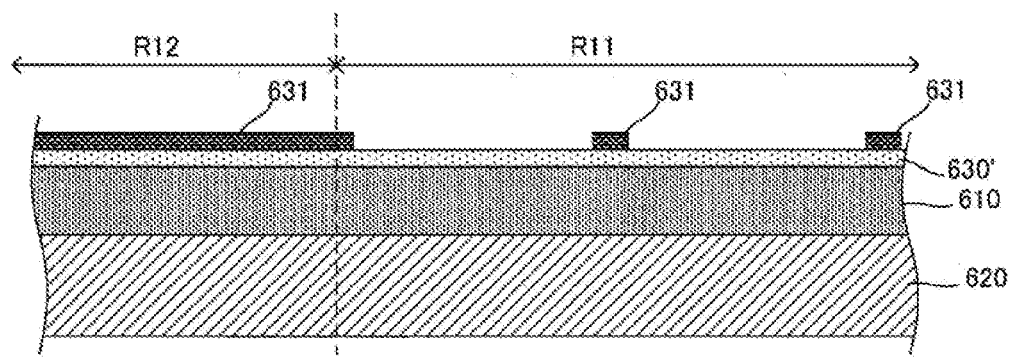

In FIGS. 19A, 19B, 19C, and 19D, the resist R is formed also on a light-shielding film 631' on the OPB pixel region R12 (FIG. 19B), and also after etching, the light-shielding film 631' laid throughout the OPB pixel region R12 in plan view is left as the light-shielding film 631. Thereby, in the OPB pixel P12, light incident on the semiconductor substrate 610 is shielded by the light-shielding film 631 (FIG. 19C). Thus, the subsequent step of forming the configuration corresponding to the light-shielding film 533 according to the fifth embodiment is not executed.

Figure 19D:
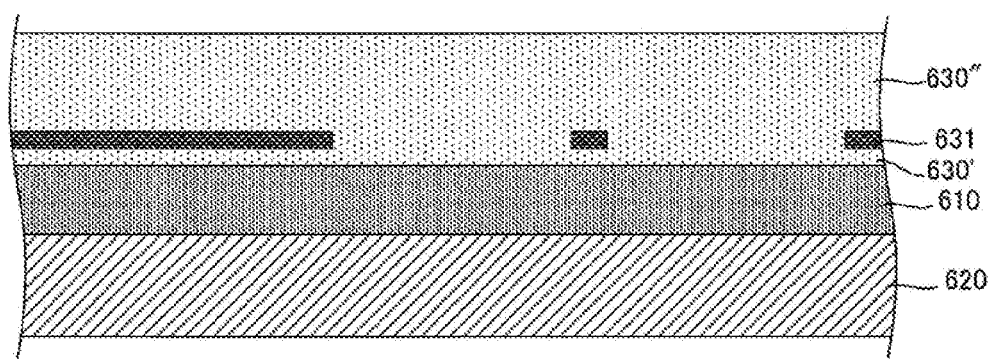

The manufacturing method is similar to the aforementioned manufacturing method according to the fifth embodiment, in that after formation of the light-shielding film 631, the same insulating material as that for the insulating layer 630' is laminated on the light-shielding film 631 to form an insulating layer 630", and the light-shielding film 631 is embedded in the insulating layers 630' and 630" (FIG. 19D). At this time, the insulating layer 630" is formed so as to have a lamination thickness higher than an upper end of a light-shielding wall 641. If a surface of the insulating layer 630" is not flat, the surface is flattened by polishing/grinding techniques such as chemical machinery polishing.

Figure 20A:
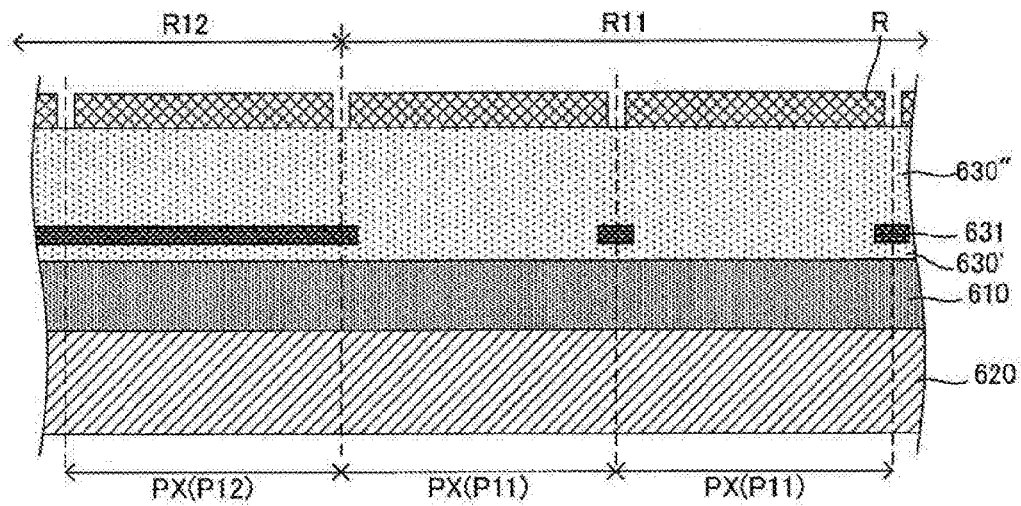
FIGS. 20A, 20B, and 20C are another diagrams for explaining an example of the manufacturing method for the solid-state imaging element according to the sixth embodiment.
Figure 20B:
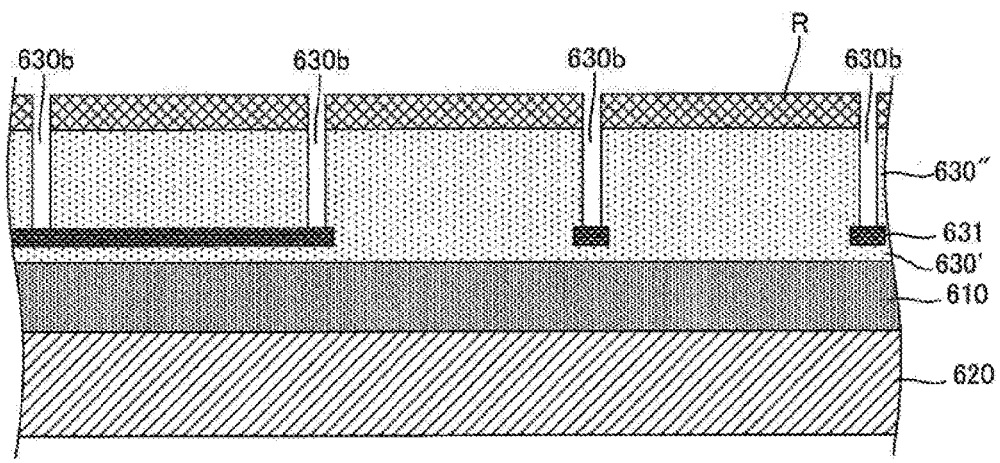
Figure 20C:
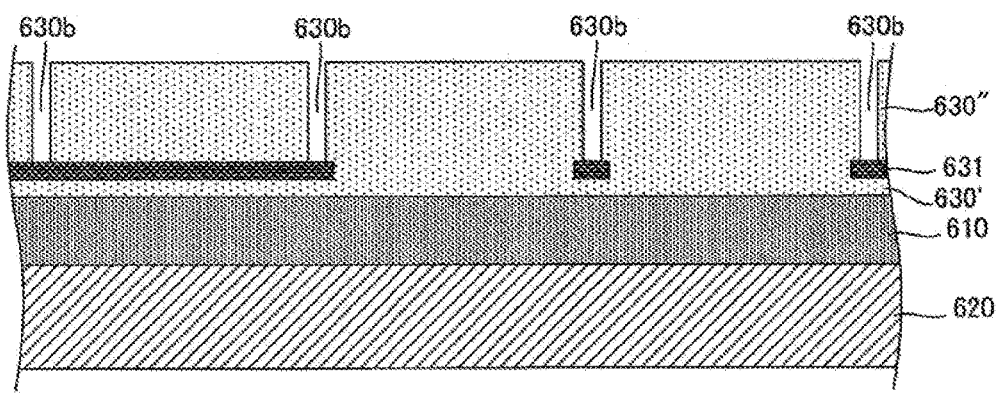

Next, vertical holes 630b having a depth reaching the upper face of the light-shielding film 631 are formed along each boundary between the unit pixels PX on the insulating layer 630" (FIGS. 20A, 20B, and 20C). A width of the vertical holes 630b can be substantially equal to a width of a light-shielding wall 632. Specifically, the resist R for covering the upper face of the insulating layer 630" excluding the range for forming the light-shielding wall 632 in plan view is formed (FIG. 20A), and a portion along each boundary between the unit pixels PX is excavated by etching until the excavation reaches the light-shielding film 631 (FIG. 20B). Subsequently, the resist R is removed to form the vertical holes 630b (FIG. 20C).

Figure 21A:
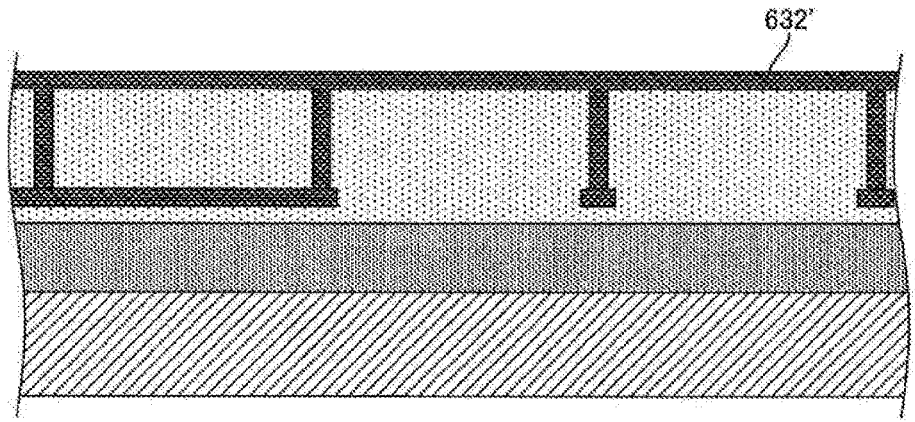
FIGS. 21A, 21B, and 21C are still another diagrams for explaining an example of the manufacturing method for the solid-state imaging element according to the sixth embodiment.
Figure 21B:
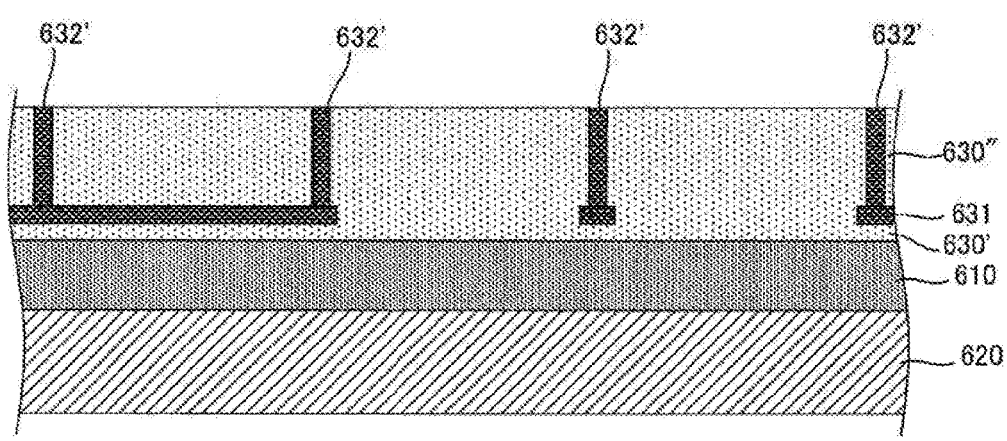

Subsequently, structures as bases of the light-shielding wall 632 and the light-shielding wall 641 are formed in the same step (FIG. 21A). Specifically, a film made of the aforementioned light-shielding material and the like is laminated on the insulating layer 630" having the vertical holes 630b. Thereby, while charging the light-shielding material into the vertical holes 630b, a certain amount of a light-shielding material is laminated also on the upper face of the insulating layer 630" to form a light-shielding structure 632'. The portion laminated on the upper face of the insulating layer 630" of the light-shielding structure 632' is removed by polishing/grinding techniques such as chemical machinery polishing to leave only the light-shielding structure 632' in the vertical hole 630b (FIG. 21B). The lower part of the remaining light-shielding structure 632' is the light-shielding wall 632, and the upper part is the light-shielding wall 641 as a fourth light-shielding portion.

Figure 21C:
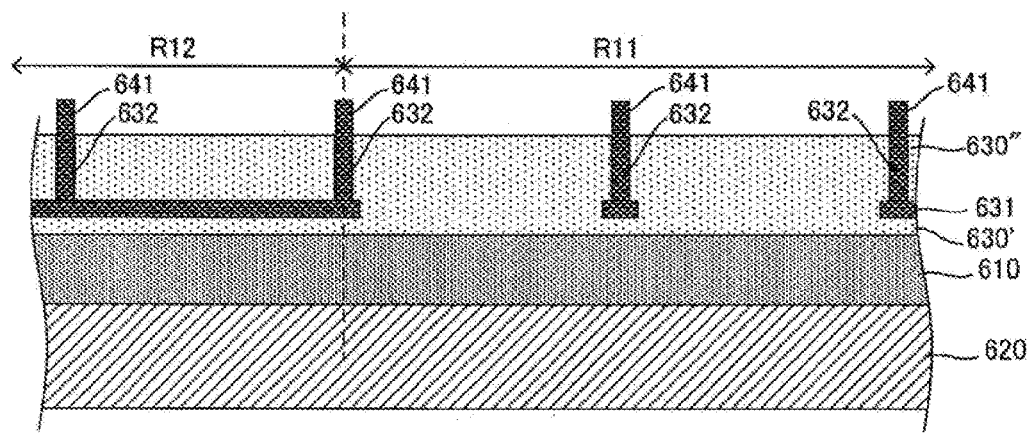

Subsequently, the insulating layer 630" around the light-shielding wall 641 in the vertical hole 630b is removed by dry etching or the like to expose the light-shielding wall 641 (FIG. 21C). Through this step, the insulating layer 630 is completed.

Figure 22A:
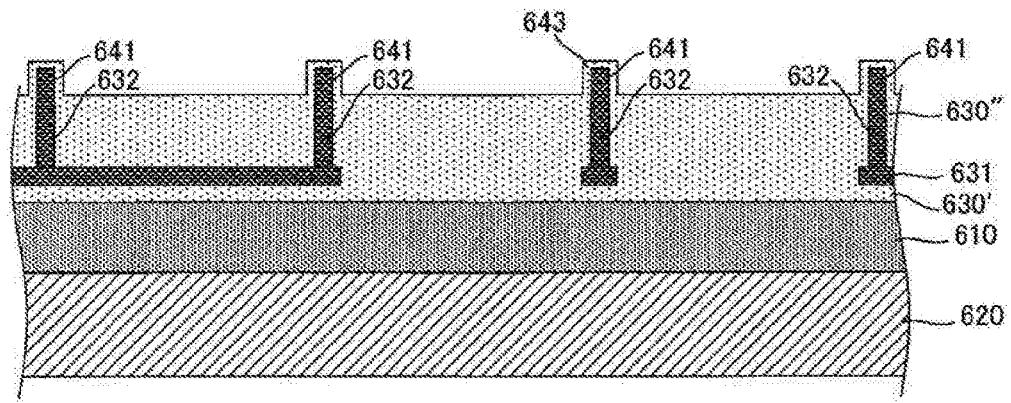
FIGS. 22A, 22B, and 22C are further another diagrams for explaining an example of the manufacturing method for the solid-state imaging element according to the sixth embodiment.
Figure 22B:
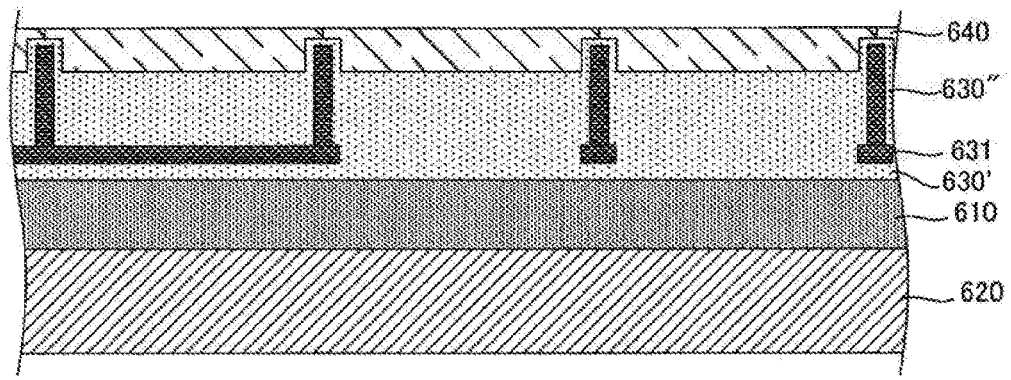
Figure 22C:
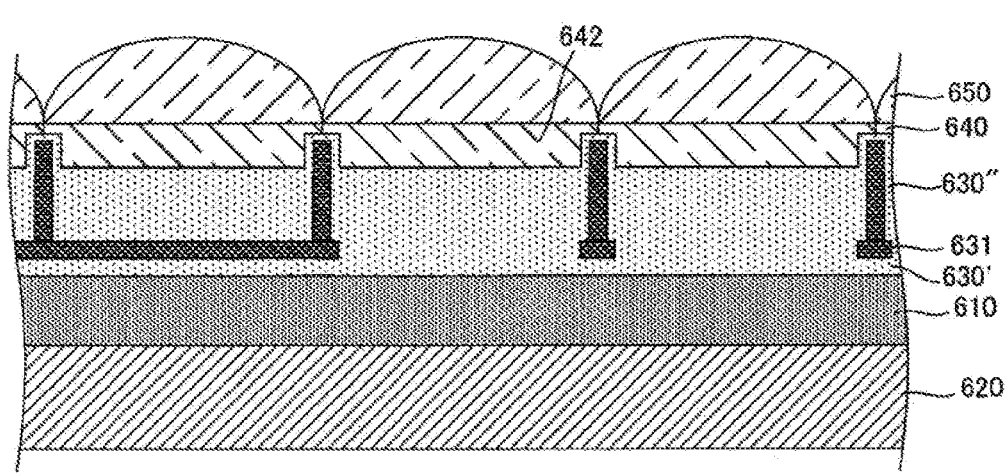

Subsequently, a cap layer 643 such as a silicone oxide film covering the upper faces of the light-shielding wall 641 and the insulating layer 630 is uniformly laminated (FIG. 22A), on which a color filter layer 640 and an on-chip lens layer 650 are formed (FIGS. 22B and 22C). At this time, at least the lower part of a color filter 642 of the color filter layer 640 is embedded in the partitioning wall of the light-shielding wall 641.

Through the above steps, the solid-state imaging element 600 having the light-shielding wall 641 between the color filters 642 can be produced with a smaller number of steps than in the fifth embodiment.

7. Seventh Embodiment

Figure 23A:
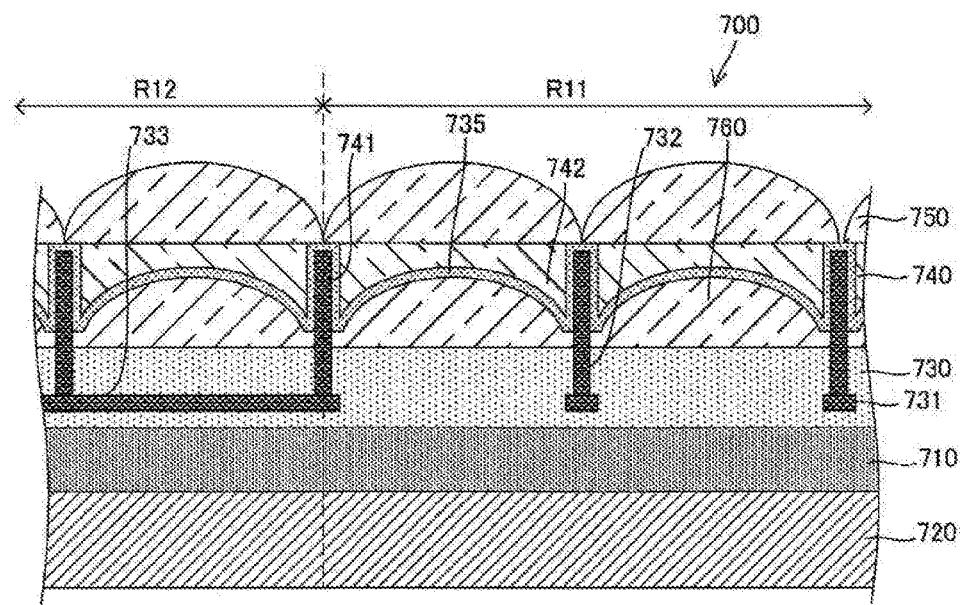
FIGS. 23A and 23B are diagrams schematically depicting a schematic sectional structure of a solid-state imaging element according to a seventh embodiment.
Figure 23B:
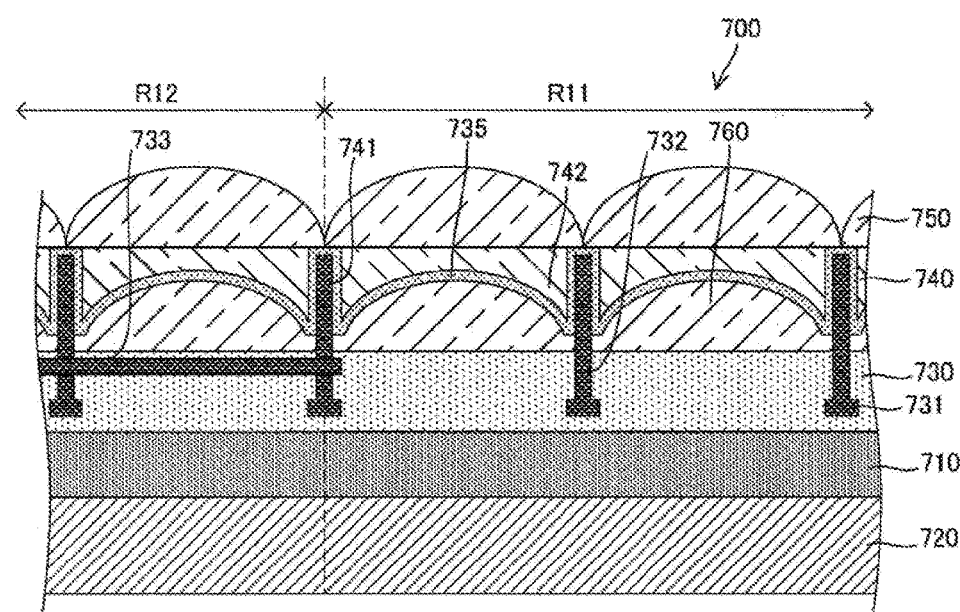

FIGS. 23A and 23B are diagrams schematically depicting a schematic sectional structure of a solid-state imaging element according to the seventh embodiment. A solid-state imaging element 700 according to the seventh embodiment has a similar structure as that of the solid-state imaging element 600 according to the sixth embodiment except for shapes of a light-shielding wall 732, a light-shielding wall 741, and a color filter layer 740. Thus, hereinafter, similar configurations as those in the sixth embodiment are represented by symbols in the sixth embodiment, of which the head number is replaced with "7," and detailed explanations thereof are omitted. Note that FIG. 23A illustrates an example that a light-shielding film 733 is placed in the vicinity of a semiconductor substrate 710 in an insulating layer 730, and FIG. 23B illustrates an example that the light-shielding film 733 is placed in the vicinity of a color filter layer 740 in the insulating layer 730. In the case of FIG. 23B, since the light-shielding film 733 is placed in the vicinity of the color filter layer 740, amounts of hydrogen supplied from the insulating layer 730 can be substantially equal between the OPB pixel region R12 and the valid pixel region R11.

Like the solid-state imaging element 600, the insulating layer 730 of the solid-state imaging element 700 has the light-shielding wall 732 for partitioning the unit pixels at the boundary, and has the light-shielding wall 741 integrally formed on the light-shielding wall 732 and functioning as a partition for the color filter layer 740.

The light-shielding wall 732 is formed such that the semiconductor substrate 710-side end portion is brought into contact with the backside face of the light-shielding film 731, and the color filter layer 740-side end portion of the light-shielding wall 732 extends to the vicinity of the surface of the color filter layer 740, or to the same vertical-direction level as that of the surface of the color filter layer 740. The light-shielding wall 732 prevents color mixture caused when light is incident on an adjacent unit pixel in the transparent insulating layer 730.

An intralayer lens 760 is laminated on the insulating layer 730, and a color filter 742 is charged into a recessed portion surrounded by the upper face of the intralayer lens 760 and the light-shielding walls 741. A cap layer 735 is interposed between the intralayer lens 760 and the color filter 742. The cap layer 735 is a thin film made of an insulating material such as $SiO_2$ and having a constant thickness.

The color filter layer 740 includes the light-shielding wall 741 formed integrally with the light-shielding wall 732 and for partitioning the unit pixels at the boundary. The upper end of the light-shielding wall 741 extends higher than the projected upper end of the intralayer lens 760. The color filter layer 740 has a structure that a range of the unit pixel is partitioned by the light-shielding wall 732, and the recessed portion surrounded by the light-shielding walls 732 and the intralayer lens 760 is entirely covered with the aforementioned cap layer 735 having a substantially constant thickness. The color filter 742 is disposed in the recessed portion covered with the cap layer 735. The color filter 742 has a recessed lower face for recessed and projected engagement with a projected lens-shaped upper face of the intralayer lens 760, and has a substantially flat upper face.

The color filter 742 is embedded in the area of each unit pixel, e.g. in a leveled shape with the upper end of the light-shielding wall 741 as an edge. The color filter 742 at such a position and having such a shape is disposed, so that the height of the color filter can be decreased and the height of the entire solid-state imaging element 700 can be decreased. In addition, self-alignment of the color filter is possible, and a positional accuracy for forming the color filter 742 can be improved.

FIGS. 24A, 24B, 24C, 24D, 25A, 25B, 25C, and 25D are diagrams for explaining an example of the manufacturing method for the solid-state imaging element according to the seventh embodiment. In the manufacturing method for the solid-state imaging element according to the seventh embodiment, the steps are similar to the steps (FIGS. 24A, 24B, 24C, and 24D) in the aforementioned manufacturing method according to the fifth embodiment, and therefore explanation thereof is omitted, and the step (FIG. 25A) and the subsequent steps will be illustrated and explained. Note that FIGS. 24A, 24B, 24C, 24D, 25A, 25B, 25C, and 25D illustrate a manufacturing method for the imaging element having the configuration in FIG. 23A.

After formation of the light-shielding film 731, a transparent insulating material such as SiO2, that is the same for the insulating layer 730, is laminated on the light-shielding film 731 to form an insulating layer 730" (FIG. 24A), and the light-shielding 731 is embedded in an insulating layer 730' and the insulating layer 730". If a surface of the insulating layer 730" is not flat, the surface is flattened by polishing/grinding techniques such as chemical machinery polishing.

Figure 24A:
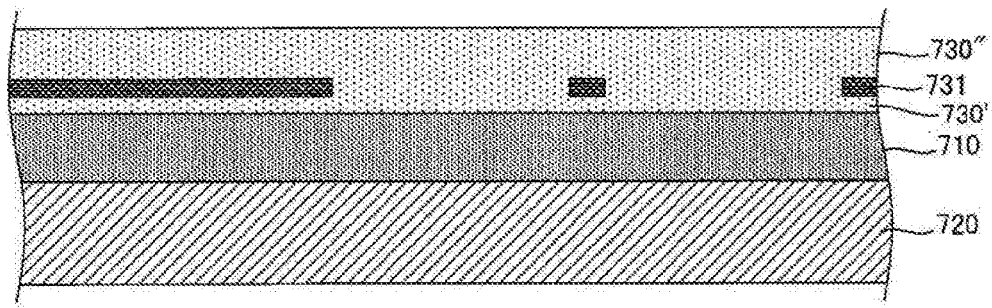
FIGS. 24A, 24B, 24C, and 24D are diagrams for explaining an example of a manufacturing method for the solid-state imaging element according to the seventh embodiment.
Figure 24B:
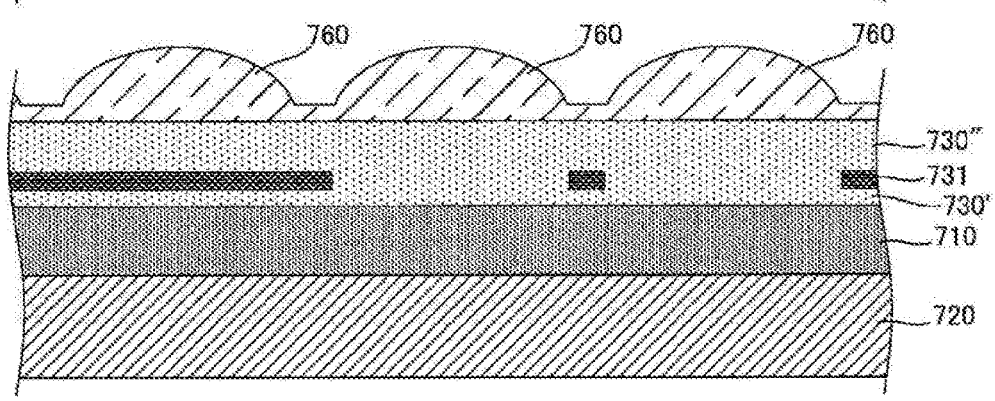

Subsequently, the intralayer lens 760 is formed. First, a high refractive index layer as the intralayer lens is formed on the insulating layer 730". Next, a hemispherical resist is laminated. This step can be performed by forming a resist in the range of the intralayer lens by lithography, and making the resist hemispherical by heat treatment (reflow). After that, the hemispherical shape of the resist is transferred to the high refractive index layer by dry etching (FIG. 24B).

Figure 24C:
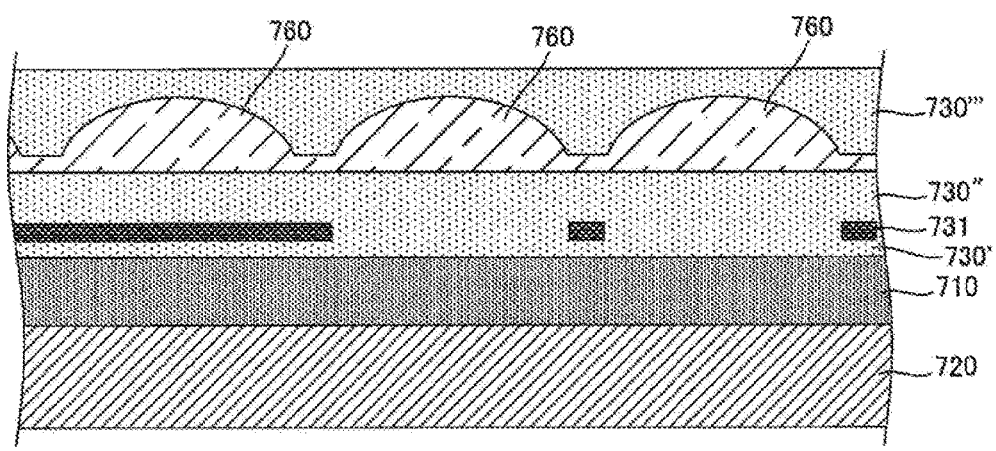

Subsequently, a transparent insulating material such as SiO2 is laminated on the intralayer lens 760 to form an insulating layer 730'''. As necessary, the surface of the insulating layer 730''' is flattened by polishing/grinding techniques such as chemical machinery polishing (FIG. 24C).

Figure 24D:
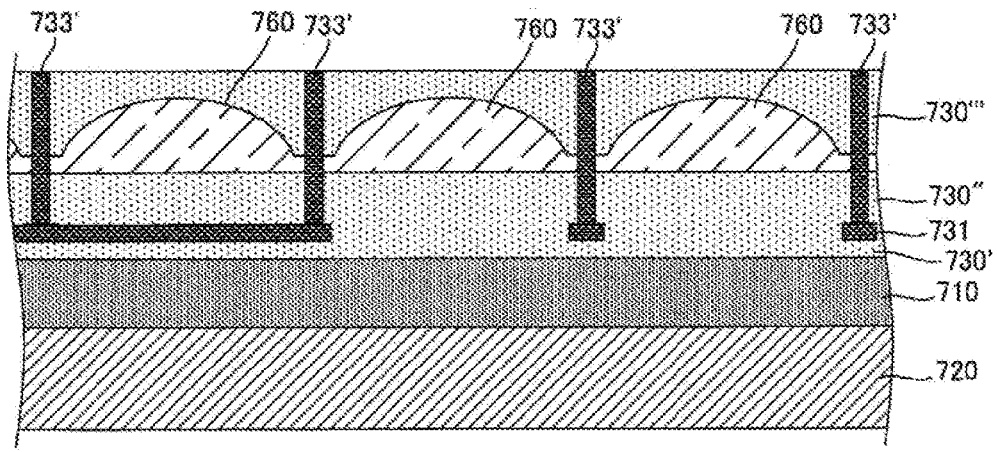

Subsequently, vertical holes 730b (not illustrated in the figure in the seventh embodiment) having a depth reaching the upper face of the light-shielding film 731 are formed along each boundary between the unit pixels PX on the insulating layer 730". Next, a film made of the aforementioned light-shielding material and the like is laminated on the insulating layer 730''' having the vertical holes 730b, and the light-shielding material is charged into the vertical holes 730b. Next, the upper face of the insulating layer 730''' is ground by polishing/grinding techniques such as chemical machinery polishing, so that the light-shielding material laminated on the insulating layer 730''' is removed to expose the insulating layer 730''', and the upper face of the insulating layer 730''' is flattened (FIG. 24D). Thereby, a light-shielding wall 733' penetrating the insulating layer 730", the boundary portion of the intralayer lens 760, and the insulating layer 730''' is formed. The light-shielding wall 733' constitutes the light-shielding wall 732 and the light-shielding wall 741.

Figure 25A:
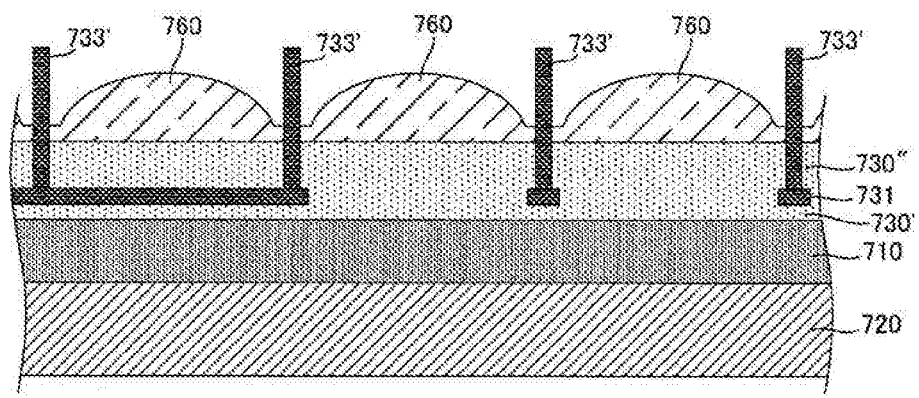
FIGS. 25A, 25B, 25C, and 25D are another diagrams for explaining an example of the manufacturing method for the solid-state imaging element according to the seventh embodiment.
Figure 25B:
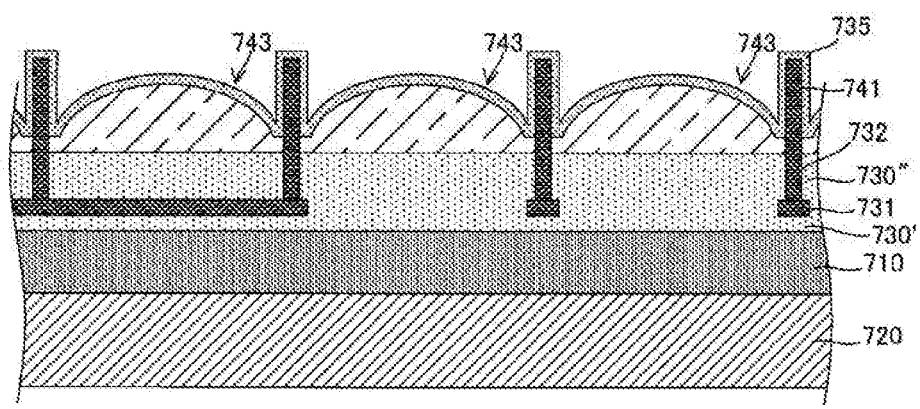

Subsequently, the insulating layer 730''' around the light-shielding wall 741 is removed by dry etching or the like to expose the light-shielding wall 733' and the intralayer lens 760 (FIG. 25A). The cap layer 735 made of SiO2 and the like is formed on the surfaces of the exposed light-shielding wall 733' and intralayer lens 760 (FIG. 25B). Thereby, for each unit pixel PX, a recessed portion 743 surrounded by the light-shielding walls 741 so as to be partitioned is formed on the intralayer lens 760.

Figure 25C:
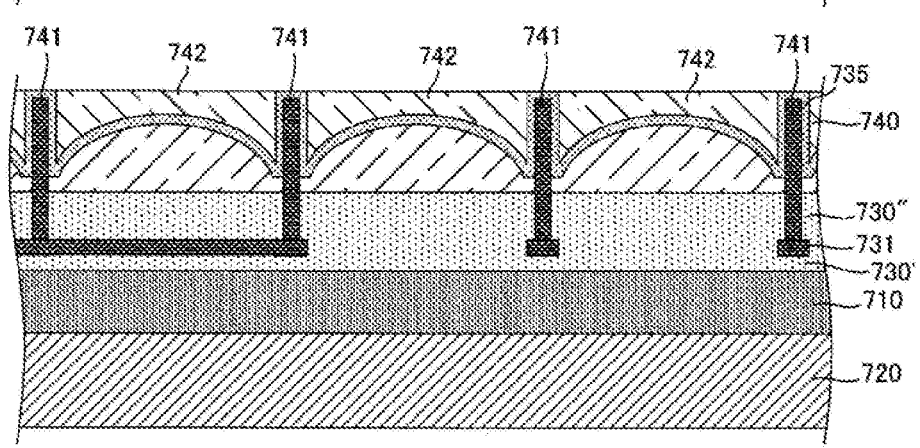
Figure 25D:
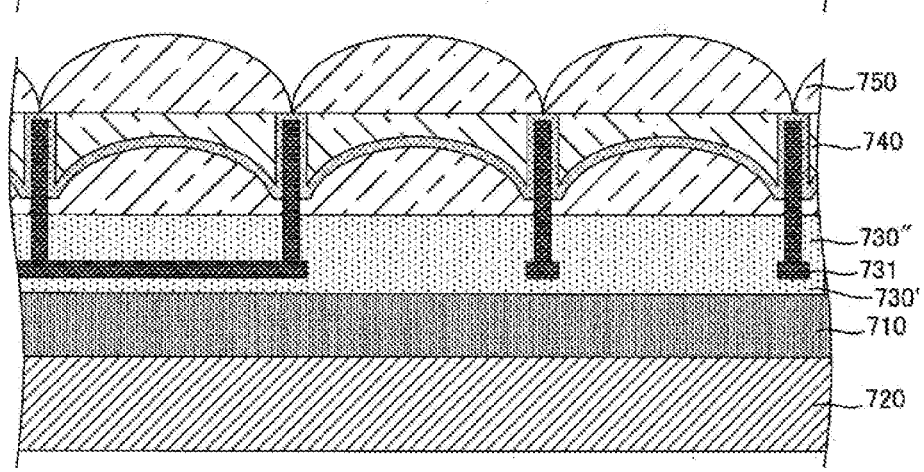

Next, a color filter material is charged into the recessed portion 743, and solidified, so that the color filter 742 having a shape for embedding each recessed portion 743 is formed in each unit pixel PX (FIG. 25C). The color filter 742 is charged into the recessed portion 743 in a leveled shape, and solidified, so that self-alignment of the position for forming the color filter 742 is possible. In addition, since a part of the color filter layer 740 overlaps the intralayer lens 760 in the vertical direction, the height of the solid-state imaging element can be decreased. In addition, the surface flatness of the color filter layer 740 is improved. An on-chip lens layer 750 is formed on the color filter layer 740 (FIG. 25D).

Through the above steps, the solid-state imaging element 700 can be produced. The solid-state imaging element 700 makes it possible to improve the positional accuracy and the surface flatness of the color filter 742, so that the height of the solid-state imaging element 700 can be decreased.

8. Eighth Embodiment

Figure 26:
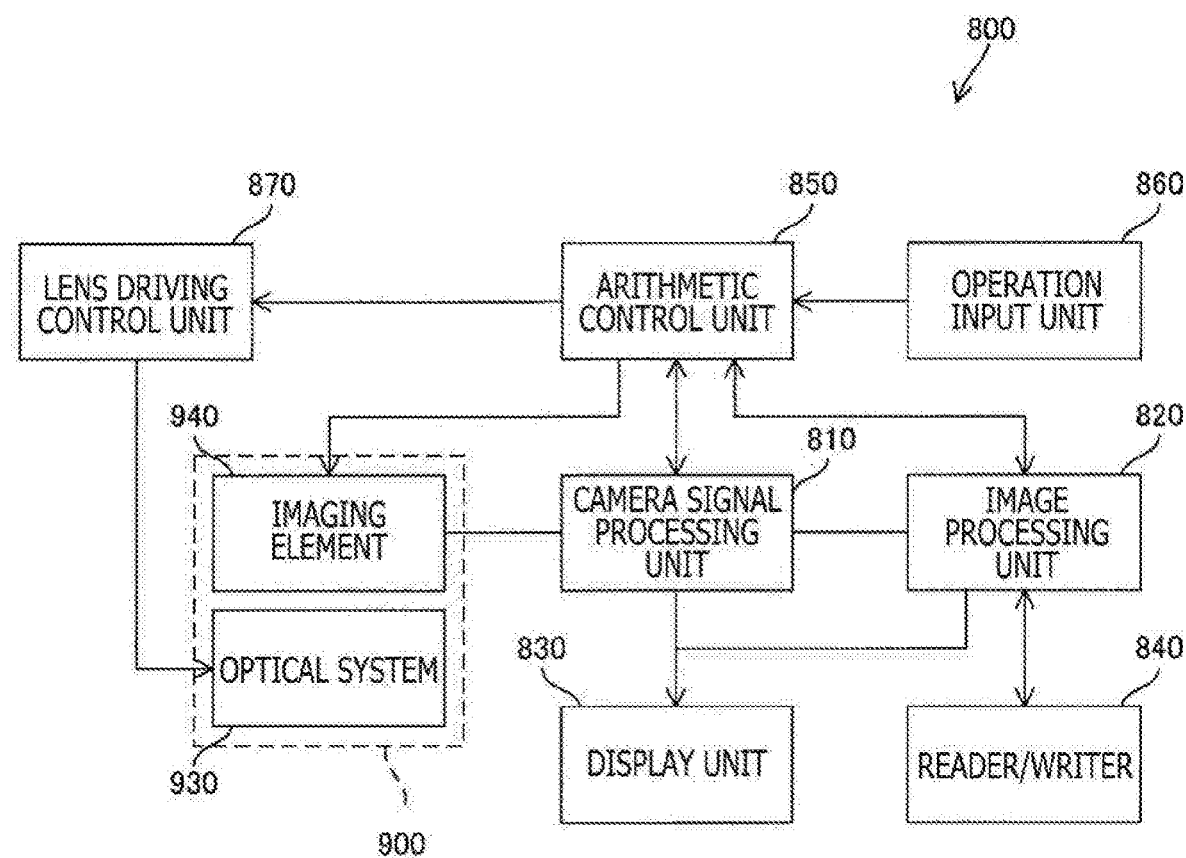
FIG. 26 is a block diagram depicting a schematic configuration of an example of an imaging apparatus.

FIG. 26 is a block diagram depicting a schematic configuration of an example of an imaging apparatus. An imaging apparatus 800 in FIG. 26 is an example of electronic equipment equipped with the semiconductor apparatus according to each of the aforementioned embodiments. Examples of the imaging apparatus 800 include a digital still camera, a digital video camera, a mobile phone with a camera, and the like.

The imaging apparatus 800 includes a module 900, a camera signal processing unit 810, an image processing unit 820, a display unit 830, a reader/writer 840, an arithmetic processing unit 850, an operation input unit 860, and a lens driving control unit 870.

The module 900 is a constituent having an imaging function, and includes an optical system 930 including a lens 911 as an imaging lens, and an imaging element 940 such as a CCD (Charge Coupled Devices) and a CMOS (Complementary Metal Oxide Semiconductor). The imaging element 940 corresponds to the solid-state imaging element according to each of the aforementioned embodiments. The imaging element 940 converts an optical image formed by the optical system 930 into electric signals, and outputs imaging signals (image signals) corresponding to the optical image.

For the image signals output from the imaging element 940, the camera signal processing unit 810 performs various types of signal processing such as analog/digital conversion, noise removal, image quality correction, and conversion into luminance/color difference signals.

The image processing unit 820 records and reproduces the image signals, and performs compression encoding/extension decoding of image signals based on a predetermined image data format, conversion of data specifications such as resolution, and the like.

The display unit 830 has a function of displaying various data such as indications corresponding to an operation input into the operation input unit 860, and taken images.

The reader/writer 840 writes data into an external memory medium such as a memory card, and reads out data from the external memory medium. The reader/writer 840 performs, e.g. writing of image data encoded by the image processing unit 820 into the external memory medium, output of image data read out from the external memory medium into the image processing unit 820, and the like.

The arithmetic processing unit 850 is a constituent that functions as a control unit for controlling each circuit block of the imaging apparatus 800, and controls each circuit block based on operation input signals and the like from the operation input unit 860. Based on control signals from the arithmetic processing unit 850, a driver for driving the module 900 controls a drive motor for driving the lens, and the like.

The operation input unit 860 includes a switch, a touch panel, and the like for a user to perform a required operation. For example, the operation input unit 860 includes a shutter release operation element for a shutter operation, a selection operation element for selecting an operation mode, and the like, and outputs operation input signals corresponding to an operation input by the user into the arithmetic processing unit 850.

9. Applicable Example for Endoscopic Surgery System

The technology according to the present disclosure (present technology) can be applied to various products. For example, the technology according to the present disclosure may be applied to an endoscopic surgery system.

Figure 27:
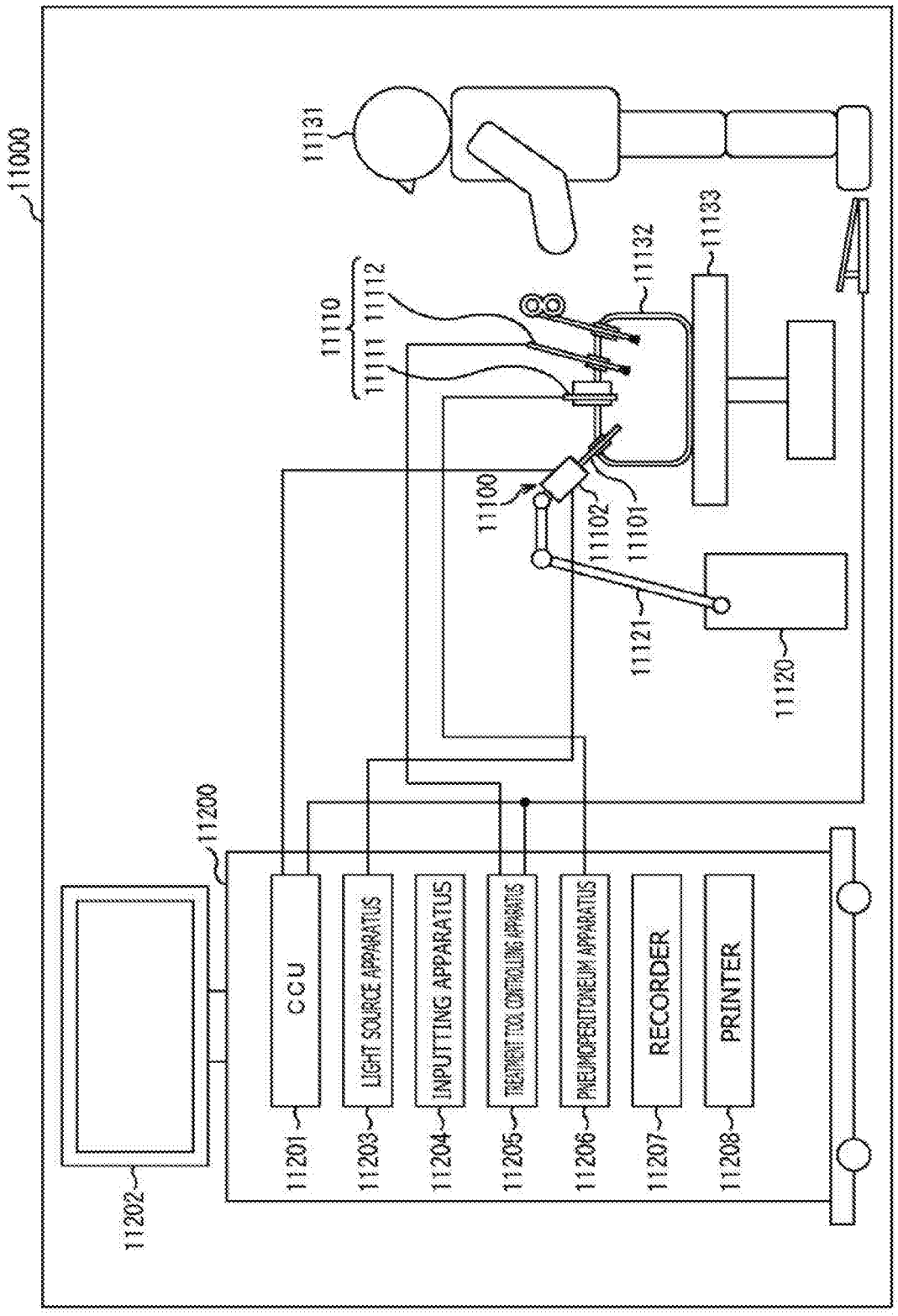
FIG. 27 is a view depicting an example of a schematic configuration of an endoscopic surgery system.

FIG. 27 is a view depicting an example of a schematic configuration of an endoscopic surgery system to which the technology according to an embodiment of the present disclosure (present technology) can be applied.

In FIG. 27, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G, and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 28:
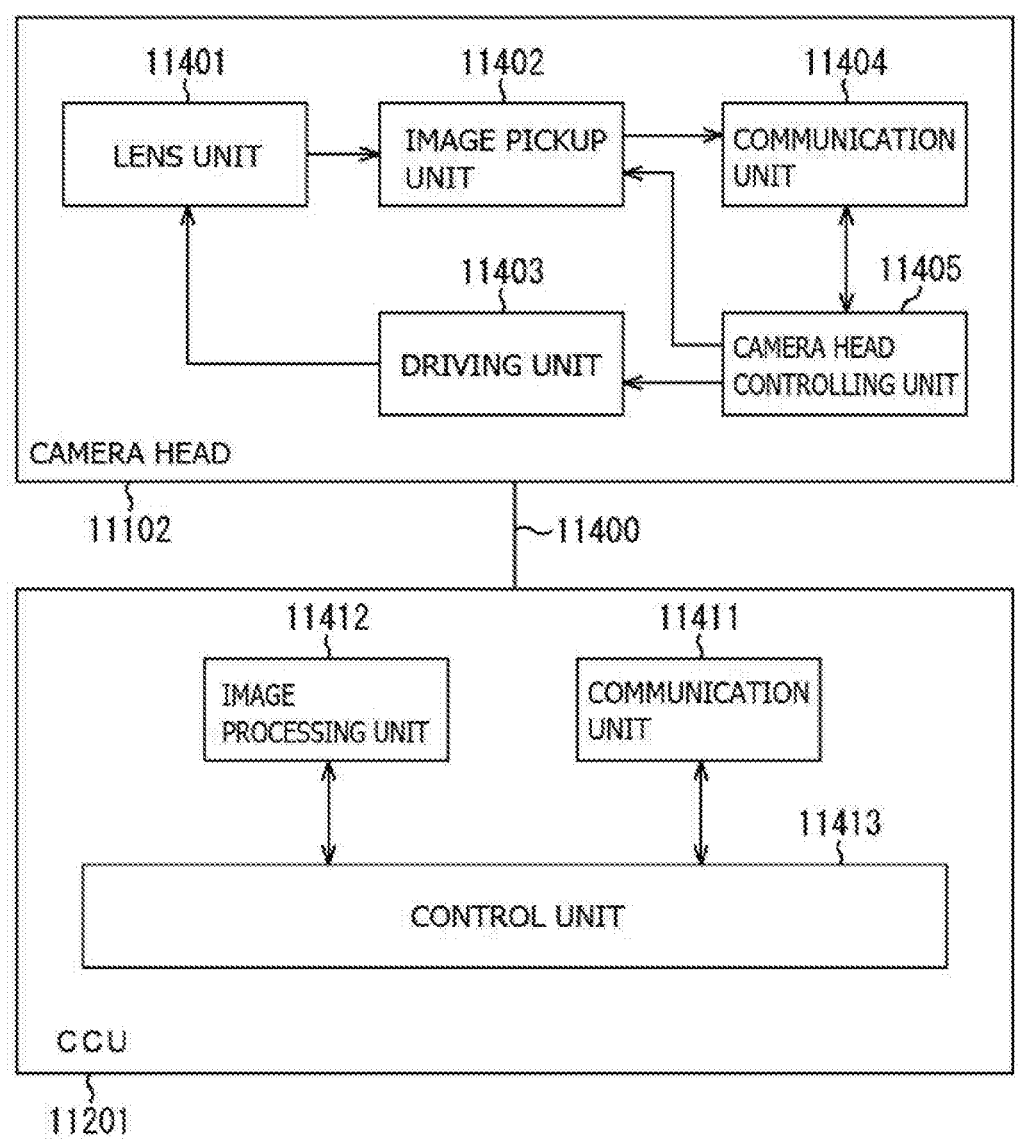
FIG. 28 is a block diagram depicting an example of a functional configuration of a camera head and a camera control unit (CCU).

FIG. 28 is a block diagram depicting an example of a functional configuration of the camera head 11102 and the CCU 11201 depicted in FIG. 27.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

As described above, an example of the endoscopic surgery system to which the technology according to the present disclosure can be applied has been explained. The technology according to the present disclosure can be applied to the image pickup unit 11402 of the camera head 11102 among the configurations explained above. Specifically, the solid-state imaging element 100 in FIGS. 1A and 1B can be applied to the image pickup unit 11402. The image quality can be improved by applying the technology according to the present disclosure to the image pickup unit 11402, so that the surgeon can surely confirm the surgical region.

Incidentally, although an endoscopic surgery system has been explained as an example herein, the technology according to the present disclosure may be applied to, e.g. a microscopic surgery system, or the like.

10. Applicable Example for Mobile Body

The technology according to the present disclosure (present technology) can be applied to various products. For example, the technology according to the present disclosure may be achieved as an apparatus mounted on any type of mobile bodies such as automobile, electric automobile, hybrid electric automobile, motorcycle, bicycle, personal mobility, airplane, drone, vessel, and robot.

Figure 29:
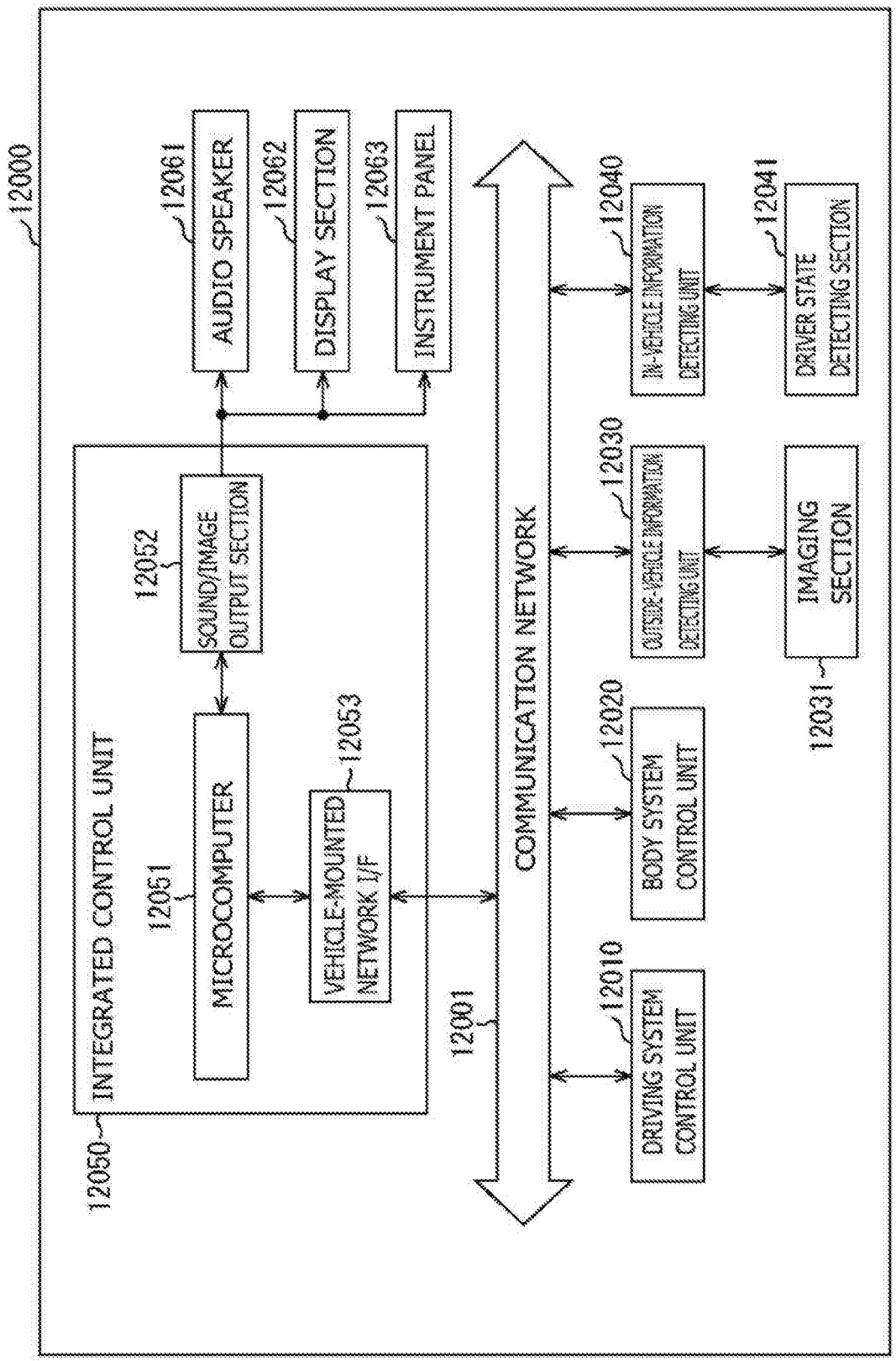
FIG. 29 is a block diagram depicting an example of schematic configuration of a vehicle control system.

FIG. 29 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 29, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 29, an audio speaker 12061, a display section 12062, and an instrument panel 12063 are illustrated as the output device. The display section 12062 may, for example, include at least one of an on-board display and a head-up display.

Figure 30:
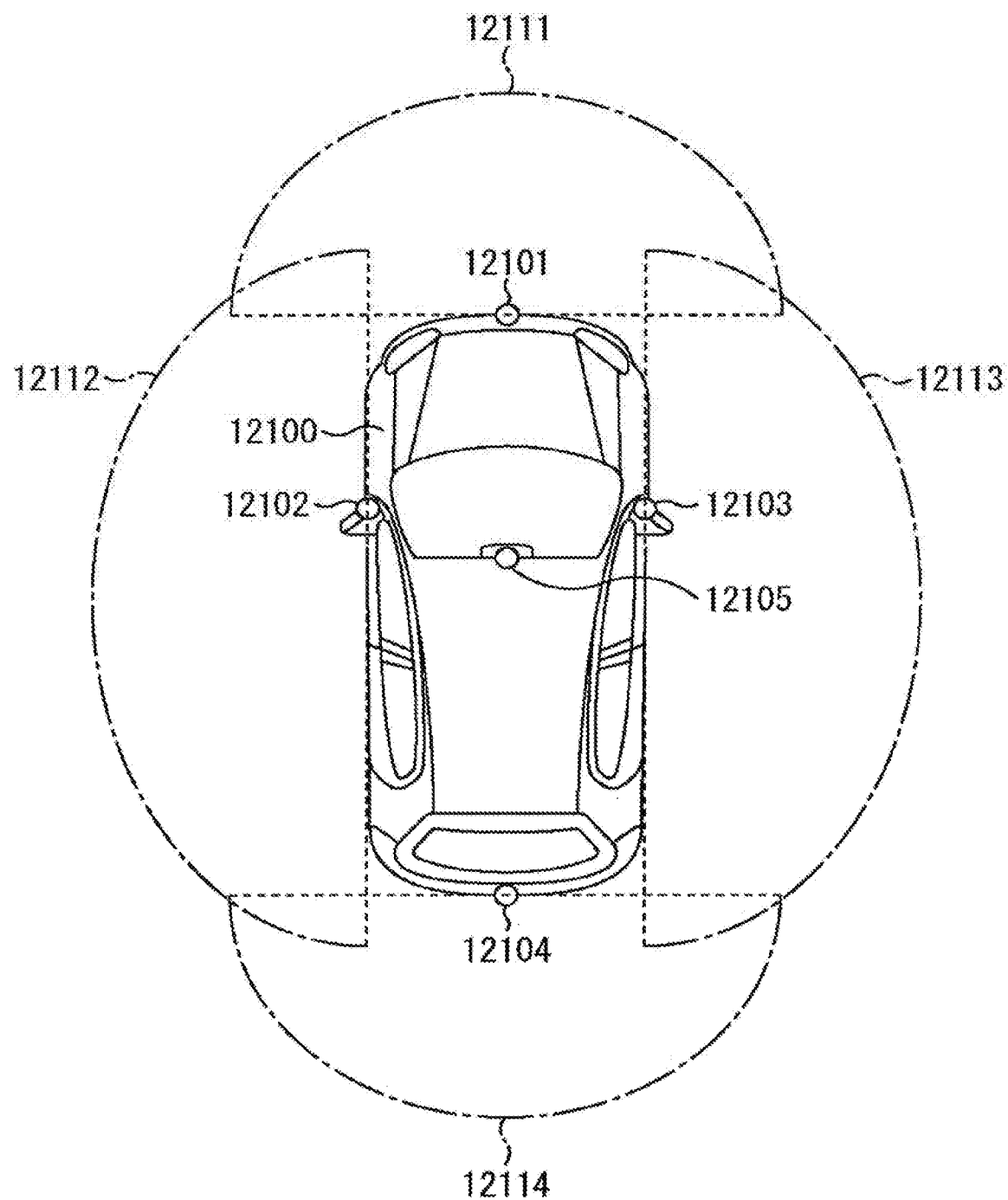
FIG. 30 is a diagram of assistance in explaining an example of installation positions of an outside-vehicle information detecting section and an imaging section.

FIG. 30 is a diagram depicting an example of the installation position of the imaging section 12031.

In FIG. 30, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 30 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been explained above. The technology according to the present disclosure can be applied to the imaging section 12031 among the configurations explained above. Specifically, the solid-state imaging element 100 in FIGS. 1A and 1B can be applied to the imaging section 12031. The image quality of the taken image can be improved by applying the technology according to the present disclosure to the imaging section 12031, so that fatigue of the driver can be reduced.

Note that the present technology is not limited to the aforementioned embodiments, and the present technology includes a configuration that the respective constituents disclosed in the aforementioned embodiments are replaced with each other or their combinations are changed, a configuration that known technologies, and the respective constituents disclosed in the aforementioned embodiments are replaced with each other or their combinations are changed, and the like. In addition, the technical scope of the present technology is not limited to the aforementioned embodiments, and covers the matters described in claims, and equivalents thereof. Needless to say, the technical scope of the present technology extends to, e.g. an imaging element other than the front-illuminated type imaging element and CMOS imaging element formed by sequentially laminating the wiring layer, the insulating layer, and the color filter layer on the semiconductor substrate.

Furthermore, the present technology can have a configuration as described below.

(1)

A solid-state imaging element including:

a plurality of pixels including a color filter for transmitting a light having a predetermined wavelength among incident lights, a photoelectric conversion portion formed on a semiconductor substrate and for performing photoelectric conversion in accordance with a light transmitted through the color filter, and an insulating layer placed between the color filter and the semiconductor substrate;

light-shielding pixels among the plurality of pixels, further including a first light-shielding portion disposed in a vicinity of the color filter on the insulating layer and for shielding the light transmitted through the color filter in its own pixel; and a second light-shielding portion disposed on the insulating layer between the plurality of pixels and the light-shielding pixels, and for shielding a light transmitted through the color filter of the adjacent pixel.

(2)

The solid-state imaging element according to (1), in which the plurality of pixels and the light-shielding pixels include a hydrogen source for supplying hydrogen to the semiconductor substrate during heat treatment in a step of manufacturing their own solid-state imaging element between the semiconductor substrate and the first light-shielding portion.

(3)

The solid-state imaging element according to (2), in which the plurality of pixels and the light-shielding pixels include an intralayer lens as the hydrogen source for condensing the light transmitted through the color filter to the photoelectric conversion portion.

(4)

The solid-state imaging element according to (2) or (3), further including:

a valid pixel region where the plurality of pixels is disposed; and a light-shielding pixel region including a plurality of the light-shielding pixels disposed outside the valid pixel region.

(5)

The solid-state imaging element according to (4), in which the plurality of light-shielding pixels each includes the hydrogen source formed in a different size depending on a distance from the valid pixel region.

(6)

The solid-state imaging element according to (4), in which the plurality of light-shielding pixels further includes a third light-shielding portion disposed adjacent to an end portion of the second light-shielding portion in a vicinity of the semiconductor substrate and having an opening portion.

(7)

The solid-state imaging element according to (6), in which the plurality of light-shielding pixels each includes the third light-shielding portion having the opening portion formed in a different size depending on a distance from the valid pixels.

(8)

The solid-state imaging element according to (1), in which the plurality of pixels further includes a fourth light-shielding portion which is adjacent to the second light-shielding portion and which extends to a region where the color filter is disposed between the plurality of pixels and the light-shielding pixels to shield the light transmitted through the color filter of the adjacent pixel.

(9)

An imaging apparatus including:

a plurality of pixels including a color filter for transmitting a light having a predetermined wavelength among incident lights, a photoelectric conversion portion formed on a semiconductor substrate and for performing photoelectric conversion in accordance with a light transmitted through the color filter, and an insulating layer placed between the color filter and the semiconductor substrate;

light-shielding pixels among the plurality of pixels, further including a first light-shielding portion disposed in a vicinity of the color filter on the insulating layer and for shielding the light transmitted through the color filter in its own pixel;

a second light-shielding portion disposed on the insulating layer between the plurality of pixels and the light-shielding pixels, and for shielding a light transmitted through the color filter of the adjacent pixel; and a processing circuit for processing image signals based on electric charges generated by photoelectric conversion in each photoelectric conversion portion in the plurality of pixels and the light-shielding pixels.

REFERENCE SIGNS LIST

10 . . . Semiconductor substrate, 10F . . . Top face, 10R . . . Backside face, 12 . . . OPB pixel, 20 . . . Wiring layer, 30 . . . Insulating layer, 30' . . . Insulating layer, 30a . . . Stepped portion, 30b . . . Vertical hole, 30" . . . Insulating layer, 31 . . . Light-shielding film, 31' . . . Light-shielding film, 31a . . . Light-receiving region, 31b . . . Light-shielding region, 32 . . . Light-shielding wall, 33 . . . Light-shielding film, 33 . . . Insulating film, 33' . . . Light-shielding film, 40 . . . Color filter layer, 50 . . . On-chip lens layer, 100 . . . Solid-state imaging element, 200 . . . Solid-state imaging element, 260 . . . Intralayer lens, 300 . . . Solid-state imaging element, 334 . . . Opening, 400 . . . Solid-state imaging element, 460 . . . Intralayer lens, 500 . . . Solid-state imaging element, 510 . . . Semiconductor substrate, 510F . . . Top face, 510R . . . Backside face, 520 . . . Wiring layer, 530 . . . Insulating layer, 530' . . . Insulating layer, 530b . . . Vertical hole, 531 . . . Light-shielding film, 531' . . . Light-shielding film, 531a . . . Light-receiving region, 531b . . . Light-shielding region, 532 . . . Light-shielding wall, 533 . . . Light-shielding film, 533' . . . Light-shielding film, 535 . . . Cap layer, 540 . . . Color filter layer, 541 . . . Light-shielding wall, 542 . . . Color filter, 550 . . . On-chip lens layer, 600 . . . Solid-state imaging element, 610 . . . Semiconductor substrate, 630 . . . Insulating layer, 630' . . . Insulating layer, 630b . . . Vertical hole, 631 . . . Light-shielding film, 631' . . . Light-shielding film, 632 . . . Light-shielding wall, 632' . . . Light-shielding structure, 633 . . . Light-shielding film, 640 . . . Color filter layer, 641 . . . Light-shielding wall, 642 . . . Color filter, 643 . . . Cap layer, 650 . . . On-chip lens layer, 700 . . . Solid-state imaging element, 710 . . . Semiconductor substrate, 730 . . . Insulating layer, 730' . . . Insulating layer, 730b . . . Vertical hole, 731 . . . Light-shielding film, 732 . . . Light-shielding wall, 733 . . . Light-shielding wall, 733' . . . Light-shielding wall, 735 . . . Cap layer, 740 . . . Color filter layer, 741 . . . Light-shielding wall, 742 . . . Color filter, 742 . . . Light-shielding wall, 742 . . . Intralayer lens, 743 . . . Recessed portion, 743 . . . Recessed portion, 750 . . . On-chip lens layer, 760 . . . Intralayer lens, 800 . . . Imaging apparatus, 810 . . . Camera signal processing unit, 820 . . . Image processing unit, 830 . . . Display unit, 840 . . . Writer, 850 . . . Arithmetic processing unit, 860 . . . Operation input unit, 870 . . . Lens driving control unit, 900 . . . Module, 911 . . . Lens, 930 . . . Optical system, 940 . . . Imaging element, OPB . . . Valid pixel, PX . . . Unit pixel, PX1 . . . Unit pixel, PX2 . . . Unit pixel, P11 . . . Valid pixel, P12 . . . Optical black pixel (OPB pixel), R . . . Resist, R1 . . . Pixel region, R11 . . . Valid pixel region, R12 . . . Optical black pixel region (OPB pixel region), R2 . . . Peripheral circuit region, R21 . . . Peripheral circuit region, R22 . . . Peripheral circuit region, 11402 . . . Image pickup unit, 12031 . . . Imaging section

The invention claimed is:

1. A solid-state imaging element, comprising:
a plurality of pixels that includes a plurality of valid pixels and a plurality of light-shielding pixels, wherein each pixel of the plurality of pixels includes:
a color filter, wherein the color filter is configured to transmit a light having a determined wavelength among a plurality of incident lights;
a semiconductor substrate;
a photoelectric conversion portion on the semiconductor substrate, wherein the photoelectric conversion portion is configured to perform photoelectric conversion based on the light transmitted through the color filter; and
an insulating layer between the color filter and the semiconductor substrate, wherein
the plurality of light-shielding pixels includes:
a first light-shielding portion in a vicinity of the color filter on the insulating layer, wherein the first light-shielding portion is configured to shield the light transmitted through the color filter in a respective light-shielding pixel of the plurality of light-shielding pixels; and
a plurality of second light-shielding portions on the insulating layer between the plurality of valid pixels and the plurality of light-shielding pixels, wherein
each second light-shielding portion of the plurality of second light-shielding portions is configured to shield the light transmitted through the color filter of an adjacent pixel of the plurality of pixels, and
a first end of the first light-shielding portion and a second end of the first light-shielding portion are in contact with different second light-shielding portions of the plurality of second light-shielding portions.

2. The solid-state imaging element according to claim 1, wherein
each pixel of the plurality of valid pixels and the plurality of light-shielding pixels includes a hydrogen source, and
the hydrogen source is configured to supply hydrogen to the semiconductor substrate.

3. The solid-state imaging element according to claim 2, wherein
the plurality of valid pixels and the plurality of light-shielding pixels include an intralayer lens as the hydrogen source, and
the intralayer lens is configured to condense the light transmitted through the color filter to the photoelectric conversion portion.

4. The solid-state imaging element according to claim 2, further comprising:
a valid pixel region that includes the plurality of valid pixels; and
a light-shielding pixel region that includes the plurality of light-shielding pixels, wherein the light-shielding pixel region is outside the valid pixel region.

5. The solid-state imaging element according to claim 4, wherein
each light-shielding pixel of the plurality of light-shielding pixels includes the hydrogen source of a different size, and
a size of the hydrogen source is based on a distance from the valid pixel region to the respective light-shielding pixel.

6. The solid-state imaging element according to claim 4, wherein
the plurality of light-shielding pixels further includes a third light-shielding portion,
the third light-shielding portion is adjacent to an end portion of a respective second light-shielding portion of the plurality of second light-shielding portions, and
the third light-shielding portion is in a vicinity of the semiconductor substrate.

7. The solid-state imaging element according to claim 6, wherein
each light-shielding pixel of the plurality of light-shielding pixels includes the third light-shielding portion, and the third light-shielding portion of each light-shielding pixel has a different size, and a size of the third light-shielding portion is based on a distance from the valid pixel region to the respective light-shielding pixel.

8. The solid-state imaging element according to claim 1, wherein the plurality of pixels further includes a fourth light-shielding portion, the fourth light-shielding portion is adjacent to a respective second light-shielding portion of the plurality of second light-shielding portions, the fourth light-shielding portion protrudes into a region where the color filter is disposed, and the fourth light-shielding portion is configured to shield the light transmitted through the color filter of the adjacent pixel.

9. The solid-state imaging element according to claim 8, wherein a width of the fourth light-shielding portion is smaller than a width of the respective second light-shielding portion.

10. An imaging apparatus, comprising:

a plurality of pixels that includes a plurality of valid pixels and a plurality of light-shielding pixels, wherein each pixel of the plurality of pixels includes:

a color filter, wherein the color filter is configured to transmit a light having a determined wavelength among a plurality of incident lights;

a semiconductor substrate;

a photoelectric conversion portion on the semiconductor substrate, wherein the photoelectric conversion portion is configured to perform photoelectric conversion based on the light transmitted through the color filter; and an insulating layer between the color filter and the semiconductor substrate, wherein the plurality of light-shielding pixels includes:

a first light-shielding portion in a vicinity of the color filter on the insulating layer, wherein the first light-shielding portion is configured to shield the light transmitted through the color filter in a respective light-shielding pixel of the plurality of light-shielding pixels; and a plurality of second light-shielding portions on the insulating layer between the plurality of valid pixels and the plurality of light-shielding pixels, wherein each second light-shielding portion of the plurality of second light-shielding portions is configured to shield the light transmitted through the color filter of an adjacent pixel of the plurality of pixels, and a first end of the first light-shielding portion and a second end of the first light-shielding portion are in contact with different second light-shielding portions of the plurality of second light-shielding portions; and a processing circuit configured to process image signals based on electric charges generated by photoelectric conversion in each photoelectric conversion portion in the plurality of valid pixels and the plurality of light-shielding pixels.

* * * * *